(12) United States Patent
Ledentsov et al.

(10) Patent No.: US 8,218,972 B2
(45) Date of Patent: Jul. 10, 2012

(54) WAVELENGTH DIVISION MULTIPLEXING SYSTEM

(75) Inventors: Nikolai Ledentsov, Berlin (DE); Vitaly Shchukin, Berlin (DE)

(73) Assignee: Connector Optics Limited, St. Petersburg (RU)

( * ) Notice: Subject to any disclaimer, the term of this patent is extended or adjusted under 35 U.S.C. 154(b) by 0 days.

(21) Appl. No.: 12/828,773

(22) Filed: Jul. 1, 2010

(65) Prior Publication Data

US 2010/0278201 A1 Nov. 4, 2010

Related U.S. Application Data

(62) Division of application No. 12/187,721, filed on Aug. 7, 2008, now Pat. No. 7,772,615.

(60) Provisional application No. 60/935,395, filed on Aug. 10, 2007.

(51) Int. Cl.
*H04B 10/18* (2006.01)
*G02F 1/23* (2006.01)

(52) U.S. Cl. .......................................... 398/141; 398/48

(58) Field of Classification Search .................... 398/48, 398/141
See application file for complete search history.

(56) References Cited

U.S. PATENT DOCUMENTS

| | | | |
|---|---|---|---|
| 4,790,635 A | 12/1988 | Apsley | |
| 4,991,179 A | 2/1991 | Deppe et al. | |
| 5,031,012 A | 7/1991 | Cunningham et al. | |
| 5,305,330 A * | 4/1994 | Rieder et al. | 372/29.021 |
| 5,340,998 A | 8/1994 | Kasahara | |
| 5,355,237 A * | 10/1994 | Lang et al. | 385/14 |
| 5,404,373 A | 4/1995 | Cheng | |
| 5,557,117 A | 9/1996 | Matsuoka et al. | |
| 7,105,866 B2 | 9/2006 | El-Zein et al. | |

* cited by examiner

*Primary Examiner* — Danny Leung
(74) *Attorney, Agent, or Firm* — Laurence A. Greenberg; Werner H. Stemer; Ralph E. Locher

(57) ABSTRACT

A wavelength division multiplexing system has an array of wavelength-tunable lasers with at least two wavelength-tunable lasers emitting laser light at mutually different wavelengths, a first diffraction grating, an optical fiber, a second diffraction grating, and an array of photodetectors. The laser light emitted by the different wavelength-tunable lasers wavelengths impinges upon the first diffraction grating where it is reflected so as to impinge on an input end of the optical fiber. The light then propagates in the optical fiber and comes out from an output end of the optical fiber. Then the laser light having at least two different wavelengths further impinges on a second diffraction grating, whereupon it is reflected such that laser light having a first wavelength impinges on a first photodetector, and laser light having a second wavelength impinges on a second photodetector, which is different from the first photodetector.

3 Claims, 17 Drawing Sheets

(a) Second Bragg Reflector is switched to a non-transparent state (b)

(c) Second Bragg Reflector is switched to a transparent state (d)

WAVELENGTH DIVISION MULTIPLEXING SYSTEM

CROSS-REFERENCE TO RELATED APPLICATION

This application is a divisional, under 35 U.S.C. §120, of copending patent application Ser. No. 12/187,721, filed Aug. 7, 2008; the application also claims the priority, under 35 U.S.C. §119(e) of provisional patent application 60/935,395, filed Aug. 10, 2007, entitled "Anti-Stark Electrooptic Medium and Electrooptically Modulated Optoelectronic Device Based Thereupon;" the prior applications are herewith incorporated by reference.

BACKGROUND OF THE INVENTION

Field of the Invention

The invention pertains to the field of semiconductor devices. More particularly, the invention pertains to ultrahigh-speed optoelectronic devices, such as light-emitting diodes and laser diodes High-speed optoelectronic devices are broadly applied in modern data communication and telecommunication systems.

These devices can be separated into two categories: those directly modulated by injection of current into the gain region, and those externally modulated. Direct modulation offers the advantage of low cost but requires very high photon densities in the resonant cavity. For, example, edge-emitting lasers operating at 40 Gb/s have been reported.

The intrinsic speed is defined by the so-called "-3 dB" bandwidth, which is roughly proportional to the relaxation-oscillation frequency:

$$f_r = \frac{1}{2\pi}\sqrt{\frac{g_n p_0}{\tau_p}}, \qquad (1)$$

where $g_n$ denotes the differential gain, $p_0$ is the average photon density in the cavity, and $\tau_p$ is the cavity photon lifetime.

A first way to increase the laser bandwidth is to increase the pump current density thereby increasing the photon population of the cavity, for example, by reducing the surface area of the device for the same total current. Under pulsed excitation relaxation, an oscillation frequency as high as 70 GHz has been demonstrated in a pulsed regime at room temperature under applied voltage of 15 volts. The problem for direct modulation is the overheating of the active region in the continuous wave regime and the related saturation of the differential gain with current and the related saturation of the relaxation oscillation frequency. Another challenge for direct modulation is degradation stability of the device. At the very high current densities the degradation rate may be unacceptably high.

Another big problem of direct modulation is a high differential capacitance of the device under forward bias. The injected carriers reduce the effective thickness of the undoped layer in the p-n-junction and increase the capacitance. Thus, realization of ultrahigh-speed devices is challenging also in this case.

In contrast, indirect modulation using elecropytic effects under reverse bias has long been known in ultrahigh-speed transmitters operating at 40-60 Gb/s. For example, a 40-Gb/s open eye diagram of the electroabsorption modulator after 700-km transmission has been demonstrated.

Once the need for direct modulation is abandoned, ultrahigh-speed signal management becomes much easier. 60-100 GHz pin diode photodetectors using large mesa devices as well as other devices are known in the art.

U.S. Pat. No. 6,285,704, "Field Modulated Vertical Cavity Surface-Emitting Laser With Internal Optical Pumping", issued Sep. 4, 2001, describes a photo-pumped VCSEL. This VCSEL may be modulated by using an external electrical field applied perpendicular to the active layer, employing the Stark-effect to deliberately change the bandgap of the active layer and hence move the emission wavelength into and out of resonance with the optical cavity formed between the top and bottom mirrors. The optical output is therefore modulated by the electrical field and not by injected carriers. However, as the active region of the device is under a continuous population inversion condition, applying a reverse bias to change the bandgap may cause dramatic photocurrent, depleting the photopumped active region.

U.S. Pat. No. 5,574,738, "Multi-Gigahertz Frequency-Modulated Vertical-Cavity Surface Emitting Laser", issued Nov. 12, 1996, discloses a saturable absorber contained within the VCSEL's distributed Bragg reflector, which may itself be adjusted during fabrication or in operation. Under controllable operating conditions, the saturable absorber, strategically sized and placed, forces the VCSEL to self-pulsate (in the GHz-regime) at rates related to the local intensity, absorption, lifetime, and carrier density of the saturable absorber. In one of the embodiments, efficiency of the saturable absorber may be controlled by the quantum-confined Stark effect. Mode-locked operation, however, is usually very sensitive to the conditions of the device operation and exists only in a relatively narrow range of carefully-optimized conditions.

U.S. Pat. No. 6,396,083, entitled "Optical Semiconductor Device With Resonant Cavity Tunable in Wavelength, Application To Modulation of Light Intensity", issued May 28, 2002, discloses a device including a resonant cavity. The resonant cavity is delimited by two mirrors and at least one super-lattice that is placed in the cavity and is formed from piezoelectric semiconducting layers. The device also includes means of injecting charge carriers into the super-lattice. One disadvantage of this device is the necessity of using piezoelectric materials. The piezoelectric semiconducting layers are epitaxially grown on a $Cd_{0.88}Zn_{0.12}Te$ substrate and include a pattern composed of a layer of $Cd_{0.91}Mg_{0.09}Te$ and a layer $Cd_{0.88}Zn_{0.22}Te$, each 10 nm thick. This pattern is repeated about a hundred times. The device in this patent is a two-terminal device. The separation of carriers in a piezoelectric superlattice causes long depopulation times. Wavelength modulation and intensity modulation are always interconnected in this patent.

An electrooptic modulator based on the quantum confined Stark effect (QCSE) in a VCSEL was disclosed in our earlier U.S. Pat. No. 6,611,539, "Wavelength-Tunable Vertical Cavity Surface Emitting Laser And Method Of Making Same," issued Aug. 26, 2003, and herein incorporated by reference. The device includes active media suitable for providing gain and enabling laser action of the device, and a position-dependent electrooptic modulator region. Applying the voltage to the modulator region results in a wavelength shift of the lasing wavelength. The absorption in the modulator region remains small. The device is especially applicable for ultrahigh-speed data transfer using wavelength-modulation.

Our earlier U.S. Pat. No. 7,075,954, entitled "Intelligent Wavelength Division Multiplexing Systems Based On Arrays Of Wavelength Tunable Lasers And Wavelength Tunable Resonant Photodetectors," issued Jul. 11, 2006, which is herein incorporated by reference, disclosed high-bit rate data transfer systems based on wavelength-to-intensity modulation conversion. In this approach, a wavelength-tunable VCSEL operates in concert with a wavelength-selective photodetector on the receiver side. Modulation of the VCSEL wavelength transforms into the photodetector current modulation.

Our earlier U.S. Pat. No. 7,369,583, entitled "Electrooptically Wavelength-Tunable Resonant Cavity Optoelectronic Device For High-Speed Data Transfer," issued May 6, 2008, which is herein incorporated by reference, disclosed high-bit rate data transfer system based on a device, which contains at least one wavelength-tunable element controlled by an applied voltage and at least two resonant cavities. The resonant wavelength of the tunable element is preferably elecrooptically tuned using the quantum confined Stark effect around the resonant wavelength of the other cavity or cavities, resulting in a modulated transmittance of the system. A light-emitting medium is preferably introduced in one of the cavities permitting the optoelectronic device to work as an intensity-modulated light-emitting diode or diode laser by applying an injection current. The device preferably contains at least three electric contacts to apply forward or reverse bias and may operate as a vertical cavity surface emitting light-emitter or modulator or as a tilted cavity light emitter or modulator. The problem of this device, however, is need in very strict growth tolerances, as the device operation is extremely sensitive to the spectral position of the cavity mode of the wavelength-tunable resonating cavity with respect to the VCSEL cavity mode. Assuming the growth rate non-uniformity for different materials used in the modulator and the VCSEL sections, there is unavoidable non-uniformity in device performance across the wafer. Another disadvantage is the fact that the output power is a non-monotonous function of the applied voltage. The device has low power in the absence of the applied voltage (the cavities are out of resonance), the power is high at a certain voltage (the cavities are in resonance), and the power is again low at even higher bias voltages (the cavities are out of resonance).

Our commonly assigned, copending U.S. patent application Ser. No. 11/453,979, entitled "Electrooptically Bragg-Reflector Stopband-Tunable Optoelectronic Device For High-Speed Data Transfer", filed Jun. 16, 2006, is herewith incorporated by reference. A device contains at least one wavelength-tunable multilayer interference reflector controlled by an applied voltage and at least one cavity. The stopband edge wavelength of the wavelength-tunable multilayer interference reflector is preferably electrooptically tuned using the quantum confined Stark effect in the vicinity of the cavity mode (or a composite cavity mode), resulting in a modulated transmittance of the multilayer interference reflector. A light-emitting medium is preferably introduced in the cavity or in one of the cavities permitting the optoelectronic device to work as an intensity-modulated light-emitting diode or diode laser by applying an injection current. The device preferably contains at least three electric contacts to apply forward or reverse bias and may operate as a vertical cavity surface emitting light-emitter or modulator or as an edge-emitting light emitter or modulator. Using a multilayer interference reflector containing tunable section allows also obtaining a wavelength-tunable laser or a wavelength-tunable resonant cavity photodetector in the case where the optical field profile in the active cavity or cavities is affected by the stopband wavelength shift.

All proposed optoelectronic device comprise an electrooptic modulator, which is preferably based on the Quantum confined Stark effect. The features of the Stark-effect electrooptic medium are schematically illustrated in FIGS. 1(a) through 1(d). FIG. 1(a) shows the conduction band profile (101), the valence band profile (102), the electron wave function (103), the heavy hole wave function (104), the electron single-particle level (105), and the heavy hole single-particle level (106) in a quantum well in the absence of the electric field. For a particular quantum well sandwiched between barriers, where all materials are III-V semiconductors or III-V semiconductor alloys, the deepest hole state is a heavy hole state, wherein the light hole contribution is sufficiently small. The quantum well is symmetric, and both the center of the electron density coincides and the center of the hole density are located in the middle of the quantum well which is schematically shown by the vertical line (107). The energy separation between the electron single-particle energy level and the heavy hole single-particle energy level is shown schematically (108).

FIG. 1(b) demonstrates the same in an electric field $F \neq 0$. The effect of the electric field is the following. The potential profile for the electron (111) and the potential profile for the hole (112) within the quantum well become triangular. This has two key implications on the optical spectrum of the quantum well. First, the triangle shape of the potential leads to the fact that the energy separation (118) between the single particle electron level (115) and the single particle hole level (116) reduces with respect to the energy separation in the absence of the electric field (108). Thus, the single particle transition energy is shifted in an electric field to lower photon energies (so called red shift). This red shift persists also, if the excitonic effect is taken into account. Thus, the exciton absorption peak in an electric field is shifted to lower photon energies.

Second, the electron wave function (113) and the hole wave function (114) are shifted apart from each other. The center of the electron density and the center of the hole density no longer coincide, as illustrated by a tilted line (117). This reduce the overlap integral between the electron and the hole wave functions, and, thus, the peak absorption.

FIG. 1(c) shows schematically the exciton absorption peak in the absence of the electric field (solid line) and in the electric field (dashed line). The position of the exciton absorption peak $E_{exc}$ may be considered as an effective band gap including excitonic effects. In an applied non-zero electric field, the effective band gap including excitonic effects is reduced, $E^*_{exc} < E_{exc}$. The exciton absorption peak is shifted to lower energies (so called red spectral shift) and reduced in amplitude.

FIG. 1(d) shows schematically a resonant component of the refractive index of the electrooptic medium. A change in the absorption coefficient $\Delta\alpha$ (electroabsorption) results also in a refractive index change $\Delta n$ (electrorefraction). The latter can be calculated by Kramers-Kronig transform, (see, e.g., D. S. Chelma et al. "Room Temperature Excitonic Nonlinear Absorption and Refraction in GaAs/AlGaAs Multiple Quantum Well Structures", IEEE Journal of Quantum Electronics, Vol. QE-20 (3), pp. 265-275 (1984)), $$\Delta n(\omega) = \frac{c}{\pi} P \int_0^\infty \frac{\Delta\alpha(\omega')}{\omega'^2 - \omega^2} d\omega'. \qquad (2)$$

where $\omega$ is the frequency of light proportional to the photon energy, $\omega = E/\hbar$, $\hbar$ being the Planck constant, the symbol P indicates that the principal value of the integral has to be evaluated, and c is the velocity of light.

At energies below the resonance, the resonant component of the refractive index is positive, as shown by the solid line in FIG. 1(d). The solid line refers to the resonance contribution to the refractive index of the electrooptic medium in the absence of electric field, whereas the dashed line is the resonance contribution to the refractive index in the electric field. The vertical line points at the photon energy, at which an electroopotical device operates. This energy is preferably selected below the exciton resonance in the electrooptic medium, to ensure a low absorption in the electrooptic medium. The refractive index change of the electrooptic medium at the selected photon energy of light is a combination of two contributions. A first contribution is a positive contribution to Δn, due to a red shift of the exciton absorption peak. A second contribution is a negative contribution to Δn, due to a decrease of the peak exciton absorption. The resulting change of the refractive index is a moderate one, where two contributions of opposite signs partially compensate each other. In FIG. 1(d) the resulting refractive index change has a moderate positive value.

In realistic electric fields, ranging from zero to a few hundred kV/cm, the electrorefraction is described as a sum of a linear eletrooptic effect (Pockel's effect) and a quadratic electrooptic effect (Kerr effect), (see, e.g. J. E. Zucker, T. L. Hendrickson, and C. A. Burrus, "Electro-optic phase modulation in GaAs/AlGaAs quantum well waveguides", Applied Physics Letters, Vol. 52 (12), pp. 945-947 (1988)).

$$\Delta n = \frac{1}{2} n_0^3 (rF + sF^2), \quad (3)$$

where F is the electric field strength, $n_0$ is the refractive index in the zero electric field, and r and s are the linear and quadratic electrooptic coefficients.

In GaAs/GaAlAs quantum well structures, the quadratic electrooptic effect dominates at electric fields of about 50 kV/cm (see J. S. Weiner et al., "Quadratic electro-optic effect due to the quantum-confined Stark effect in quantum wells", Applied Physics Letters, Vol. 50 (13), pp. 842-844 (1987) and J. E. Zucker et al. "Quaternary quantum wells for electrooptic intensity and phase modulation at 1.3 and 1.55 μm", Applied Physics Letters, Vol. 54 (1), pp. 10-12 (1989)). Furthermore, the quadratic electrooptic coefficient s in GaInAs/InP, GaInAsP/InP, and GaAs/GaAlAs quantum well structures is inversely proportional to the detuning Δω between the exciton energy in the zero electric field and the photon energy below the bandgap, at which the refractive index is considered, $$\Delta n = \frac{\eta F^2}{\Delta \omega}. \quad (4)$$

Here η is the so called figure of merit, which was estimated to be of the order of $3 \times 10^{-5}$ meV cm$^2$ kV$^{-2}$. The behavior of Eq. (4) had initially been experimentally studied for quantum wells having a width between 6 and 10 nm, and detunings up to 40 meV. The electrooptic effect decreases at larger detuning (from 40 to 140 meV) much faster than given by Eq. (3) (see M. P. Earnshow and D. W. E. Allshop, "Electrooptic Effects in GaAs—AlGaAs Narrow Coupled Quantum Wells", IEEE Journal of Quantum Electronics, Vol. 37 (7), pp. 897-904; ibid. Vol. 37 (8), p. 1103 (2001)). This effect makes necessary to select relatively small detuning between the energy of light at which the device should operate, and the position of the exciton absorption peak in the zero electric field. On the other hand, the absorption coefficient in the electrooptic medium increases at smaller detunings, and a trade-off between these two trends is necessary for the selection of the proper electrooptic medium.

Thus, there are severe shortcomings for using electrooptic medium based on the Quantum-confined Stark effect. First, the value of the effect is a moderate one, and a higher value of the electrooptic effect is highly needed. Second, a red shift of the exciton absorption peak in the applied electric field necessarily enhances undesirable absorption of light in the electrooptic medium. Third, choosing a small detuning between the photon energy, at which the device tends to operate, and the exciton absorption peak, necessary to enhance the effect, would be accompanied by an increased absorption of light, which is highly undesirable. Fourth, a temperature-induced red shift of the exciton absorption peak also hinders using sufficiently small detuning.

Thus, there is a need in the art for a new electrooptic medium which will allow to overcome the major shortcomings of the QCSE-effect based optoelectronic devices.

SUMMARY OF THE INVENTION

Semiconductor electrooptic medium is disclosed showing behavior different to a medium based on Quantum confined Stark Effect. A preferred embodiment of a new electrooptic medium comprises a type-II heterojunction, selected such, that, in zero electric field, an electron and a hole are localized on the opposite sides of the heterojunction having a negligible or very small overlap of the wave functions, and correspondingly, a negligible or a very small exciton oscillator strength. Applying an electric field results in squeezing of the wave functions to the heterojunction which strongly increases the overlap of the electron and the hole wave functions, resulting in a strong increase of the exciton oscillator strength.

Another embodiment of the new electrooptic medium includes a heterojunction between a layer and a superlattice, wherein an electron and a hole in the zero electric field are localized on the opposite sides of the heterojunction, the latter being effectively a type-II heterojunction. Yet another embodiment of the new electrooptic medium comprises a heterojunction between two superlattices, wherein an electron and a hole in a zero electric field are localized on the opposite sides of the heterojunction, the latter operating effectively as a type-II heterojunction. A further embodiment of the new electrooptic medium of the present invention comprises an ultrathin quantum well layer confined by barrier layers, having an essentially different barrier heights and a thick layer, wherein, in a zero electric field, a charged particle of one sign having a large effective mass is localized in this ultrathin layer, and a particle having a different sign of the charge, having a small effective mass is not localized in this ultrathin layer, but is localized mainly in the neighboring thick layer. Thus, the heterojunction between the two layers operates effectively as a type-II heterojunction. Applying an electric field to all types of the new electrooptic medium of the present invention results in a dramatic increase of the exciton oscillator strength and, therefore, in a large positive refractive index change at the photon energies below the exciton absorption peak. A very strong increase in the optical transition photon energy can be achieved, if necessary.

A strong electrooptic effect in a new electrooptic medium allows selecting modulator elements in optoelectronic devices having a larger thickness of the intrinsic conductivity layer, and thus, a lower capacitance, which, in turn, allows operation of the devices at higher frequencies. Shift of the exciton absorption peak to higher energies with bias makes the operation of the devices robust against temperature increase, which otherwise generally results (in conventional devices) in a bandgap shrinkage and leads in conventional Stark-effect devices to increased absorption at the wavelength of operation.

New electrooptic medium can be used in all types of optoelectronic devices employing electrooptic effect. The devices include, but are not limited to Mach-Zehnder interferometers, electrooptically-modulated vertical cavity surface emitting lasers operating in a regime of intensity modulation, electrooptically modulated wavelength-tunable vertical cavity surface emitting lasers, electrooptically modulated wavelength-tunable resonant cavity photodetectors, wavelength-tunable lasers for the related wavelength-division multiplexing systems, etc.

The effect is related to the effect of increased oscillator strength of optical transitions in type-II quantum well structures, where the role of external electric field is played by an electric dipole layer caused by the accumulation of nonequilibrium electrons and holes at the different sides of a type-II heterostructure (N. N. Ledentsov, J. Böhrer, M. Beer, F. Heinrichsdorff, M. Grundmann, D. Bimberg, S. V. Ivanov, B. Ya. Meltser, I. N. Yassievich, N. N. Faleev, P. S. Kop'ev, and Zh. I Alferov, "Radiative States in type-II GaSb/GaAs quantum wells", Physical Review B, vol. 52, pp. 14058-14066 (1995)).

An intelligent wavelength division multiplexing system is disclosed that comprises an array of wavelength-tunable lasers, a first diffraction grating, an optical fiber, a second diffraction grating, and an array of photodetectors. Light emitted by different lasers having different wavelengths impinges on the first diffraction grating, is reflected at different angles and further impinges on an input end of the optical fiber. Light at different wavelengths propagates along the optical fiber, comes out at the output end of the optical fiber, and impinges on a second diffraction grating. Light having different wavelengths is reflected by the second diffraction grating at different angles such that light having different wavelengths further comes to different photodetectors. Preferably, each photodetector receives light having only one wavelength, and the system operates even if the detectors are not resonance ones Once more in summary, a semiconductor electrooptic medium is disclosed showing behavior different from a medium based on Quantum confined Stark Effect. A preferred embodiment of a new electrooptic medium comprises a type-II heterojunction, selected such, that, in zero electric field, an electron and a hole are localized on the opposite sides of the heterojunction having a negligible or very small overlap of the wave functions, and correspondingly, a zero or a very small exciton oscillator strength. Applying an electric field results in squeezing of the wave functions to the heterojunction which strongly increases the overlap of the electron and the hole wave functions, resulting in a strong increase of the exciton oscillator strength.

Another embodiment of the new electrooptic medium includes a heterojunction between a layer and a superlattice, wherein an electron and a hole in the zero electric field are localized on the opposite sides of the heterojunction, the latter being effectively a type-II heterojunction. Yet another embodiment of the new electrooptic medium comprises a heterojunction between two superlattices, wherein an electron and a hole in a zero electric field are localized on the opposite sides of the heterojunction, the latter operating effectively as a type-II heterojunction. A further embodiment of the new electrooptic medium of the present invention comprises an ultrathin quantum well layer confined by barrier layers, having an essentially different barrier heights and a thick layer, wherein, in a zero electric field, a charged particle of one sign having a large effective mass is localized in this ultrathin layer, and a particle having a different sign of the charge, having a small effective mass is not localized in this ultrathin layer, but is localized mainly in the neighboring thick layer. Thus, the heterojunction between the two layers operates effectively as a type-II heterojunction. Applying an electric field to all types of the new electrooptic medium of the present invention results in a dramatic increase of the exciton oscillator strength and, therefore, in a large positive refractive index change at the photon energies below the exciton absorption peak. A very strong increase in the optical transition photon energy can be achieved, when necessary.

BRIEF DESCRIPTION OF THE SEVERAL VIEWS OF THE DRAWING

FIG. 1(a). Electron and hole wave functions in a quantum well in the zero electric field (F=0);

FIG. 1(b). Electron and hole wave functions in a quantum well in an electric field (F≠0). The transition energy is reduced with respect to that in FIG. 1(a). The centers of the electron and hole densities are shifted one from another, which results in reduction of the overlap integral and, thus, in reduction of the exciton absorption;

FIG. 1(c). Exciton absorption spectra of a quantum well without electric field (solid line) and in electric field (dashed line). The absorption peak in an electric field is shifted to lower photon energies and the integral absorption is weaker;

FIG. 1(d). Exciton contribution to the quantum well refractive index without electric field (solid line) and in electric field (dashed line). The feature is shifted to lower photon energies with respect to those of FIG. 1(c). A refractive index change at a fixed photon energy below the exciton absorption peak is shown;

FIG. 8(a) shows schematically the device wherein the second Bragg reflector is switched to a non-transparent state;

FIG. 8(b) shows schematically the electric field strength in the resonant optical mode of the device, wherein the second DBR is switched to a non-transparent state;

FIG. 8(c) shows schematically the device wherein the second Bragg reflector is switched to a transparent state;

FIG. 8(d) shows schematically the electric field strength in the resonant optical mode of the device, wherein the second DBR is switched to a transparent state;

FIG. 15(a) shows shematically a method of the adjustment of a reference wavelength tunable laser, where the resonance wavelength of the laser is tuned until the detected signal by a photodetector reaches its maximum value.

DETAILED DESCRIPTION OF THE INVENTION

Electrooptic Medium Based on Anti-Stark Effect

Figure 1:
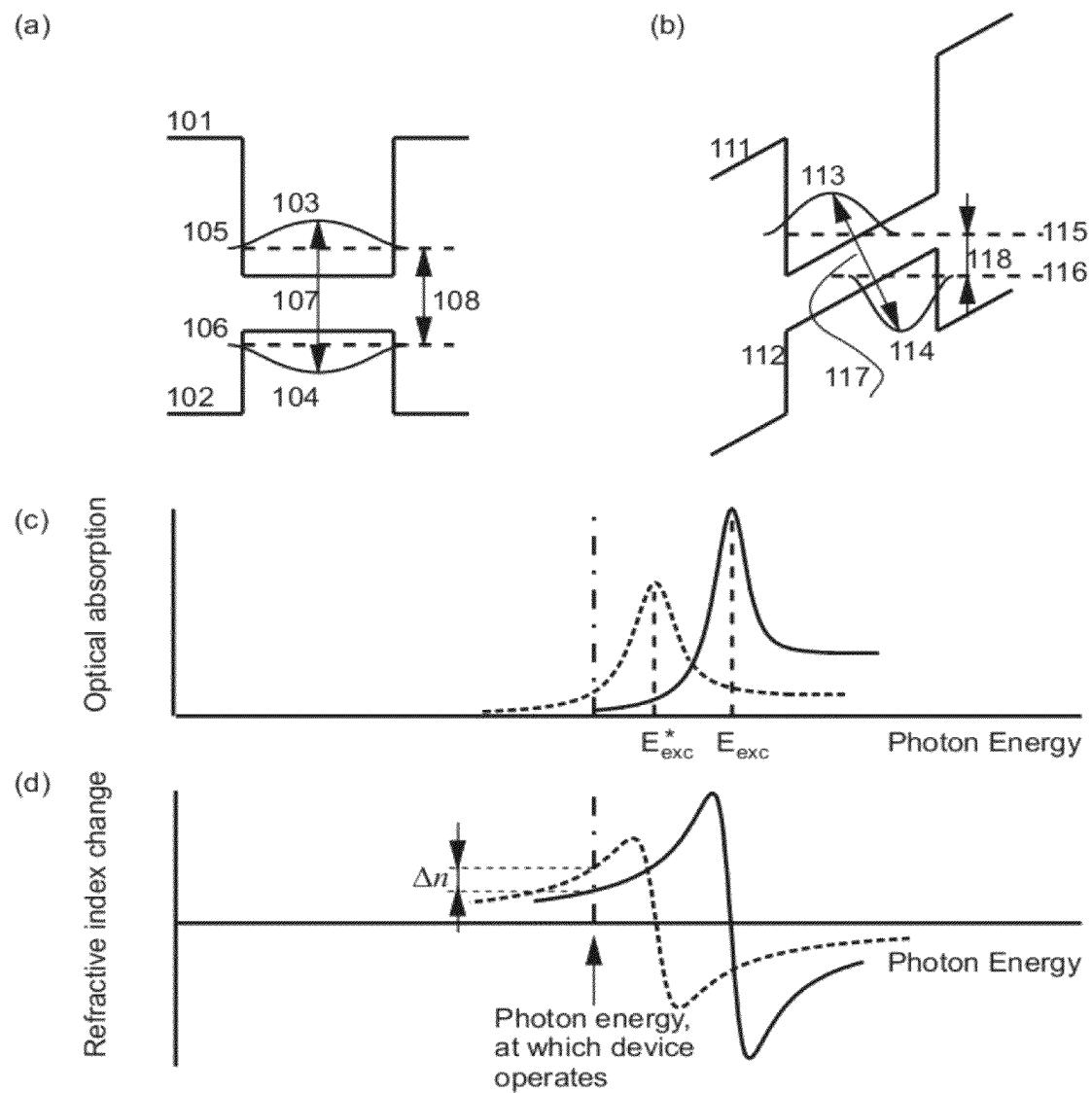
FIGS. 1(a) through 1(d). Schematic illustration of the Quantum-confined Stark effect.

The present invention provides a novel electrooptic medium that allows to overcome major shortcomings of the conventional medium based on Quantum-confined Stark effect.

FIG. 2(a) shows schematically a type-II heterojunction (210), showing further the conduction band profile (211) and the valence band profile (212). The electron wave function (213) and the hole wave function (214) are confined separately on the opposite sides from the heterointerface (219). They are only weakly confined at the heterojunction due to the Coulomb interaction. The two wave function are spatially separated which illustrated by a diagonal line (217), and the overlap between the electron and hole wave functions is close to zero. Preferably the overlap between the electron wave function and the hole wave function defined by the overlap integral is below ten per cent. The energy separation between two levels (218) is mainly determined by the separation between conduction band level on the right hand side from the heterointerface and the valence band level on the left hand side of the heterointerface.

FIG. 2(b) shows the type-II heterojunction of FIG. 2(a) in an applied electric field (F≠0). Both the conduction band profile (221) and the valence band profile (222) form triangular potentials for electrons and holes, respectively. Both the electron wave function (223) and the hole wave function (224) are strongly shifted towards the heterojunction. The separation between the center of the electron density and the center of the hole density illustrated by the diagonal line (227) is significantly reduced with respect to that in the zero electric field. Thus, the exciton absorption peak dramatically increases. Localization of electrons and holes in triangular potentials results in a shift of the single-particle electron level (225) upwards from the bottom of the conduction band profile as well as in a shift of the single-particle hole level (226) downwards from the top of the valence band. This increases also the transition energy (228) resulting in a shift of the exciton peak absorption towards higher photon energies (so called blue shift).

FIG. 2(c) shows schematically the absorption spectrum near the electron band gap energy. The figure shows negligible absorption near the absorption edge in the zero electric field (solid line). In an non-zero applied electric field a strong absorption peak appears (dashed line). The effective energy band gap including excitonic effects is increased in an applied non-zero electric field ($E^*_{exc} > E_{exc}$). The exciton absorption peak is significantly shifted to higher energies (so called blue spectral shift) with respect to the absorption edge in the zero field.

FIG. 2(d) shows schematically an exciton contribution to the refractive index of the electrooptic medium. The resonance contribution to the refractive index in the zero electric field (solid line) is negligibly small, whereas it enhances tremendously in an applied non-zero electric field (dashed line). The vertical dash-dotted line indicates the photon energy, at which the device tends to operate.

The electrooptic medium comprises a type-II heterojunction, thus the electron and hole wave functions in the zero electric field have nearly a zero overlap, and the exciton absorption peak has a zero or very small amplitude. In an applied non-zero electric field, a localization potential for an electron and a localization potential for a hole are formed such that the electron wave function is strongly shifts towards the heterojunction, and the hole wave function is strongly shifted towards the heterojunction. Thus, the electron and hole wave functions are shifted towards each other thus increasing the overlap, and, hence, the exciton absorption peak. Further, the formation of the potential profiles for electron and hole leads to a shift of the exciton absorption peak towards higher photon energies (blue shift).

Doping or modulation doping can be additionally applied to adjust the quantum well shape or bleach the exciton effect.

The two key features of a novel electrooptic medium, namely, first, an increase of the overlap between an electron and a hole, and thus an increase of the exciton absorption peak, and, second, a blue shift of the exciton absorption peak, are opposite to the corresponding features in case of the Quantum-confined Stark effect. Therefore, the effect proposed here will be termed from here and below, the anti-Stark effect, and the electrooptic media exhibiting anti-Stark effect will be termed anti-Stark electrooptic media.

As the photon energy, at which the device is set to operate is fixed, the change of the refractive index in an applied electric field is a result of two contributions. A first one is a large positive contribution due to a strong enhancement of the exciton absorption peak. A second one is a negative contribution due to a blue shift of the exciton absorption peak. As it is possible to provide a tremendous enhancement of the exciton absorption peak starting practically from zero to a large value, the resulting change of the refractive index of the electrooptic medium will be positive and large.

An anti-Stark electrooptic medium allows to overcome all major shortcomings of conventional Stark media. First, it is feasible to select the anti-Stark electrooptic medium such, that the refractive index change in an applied electric field is positive and large. Second, due to a blue shift of the exciton absorption spectrum in an applied electric field, the absorption in the electrooptic medium decreases. Third, it is therefore possible to select a smaller detuning between the exciton absorption peak and the photon energy, at which the device should operate, without increasing absorption. Fourth, it is possible to compensate the temperature-induced red shift of the exciton absorption peak, as will be shown below in one of the embodiments of the present invention. This enables functionality of the device at any temperature by adjusting the bias. Furthermore, using a photocurrent control of the calibrated electrooptic device under reverse bias one can easily define the temperature by measuring the photocurrent at a given reverse voltage and then adjust the voltage to match the best performance of the device at this temperature.

Type-II heterointerfaces in III-V compound semiconductors include, but are not limited to GaAsSb/GaAs, GaInAs/GaAsSb, AlInAs/InP, GaAsSb/GaAsN, InAlAs/AlAsSb, etc.

FIG. 3(a) shows schematically an anti-Stark electrooptic medium, according to another embodiment of the present invention. The structure (310) comprises two semiconductor superlattices (381) and (382). All heterojunctions in each of the two superlattices as well as the both heterojunctions of the intermediate layer between two superlattices are type-I heterojunctions which can be seen from the exact conduction band profile (311) and valence band profile (312). Two short-dashed lines (361) and (362) depict the coarse-scale profile of the conduction band and valence band, respectively. On a coarse scale exceeding the thickness of each individual quantum well or barrier, the conduction band profile and the valence band profile reproduce an effective type-II heterojunction. The electron wave function (313) and the hole wave function (314) function are shown schematically on a coarse scale, wherein their fine scale behavior within each individual layer is not shown. The electron and the hole wave functions are well separated, which is illustrated by a diagonal line (317) connecting the center of the electron density and the center of the hole density. Thus, the electron and the hole wave functions have a zero or a very small overlap resulting in a zero or very small exciton peak absorption. Similar to the structure in FIG. 2(a), the energy separation between two levels (318) in the structure (310) is mainly determined by the separation between the coarse scale conduction band level in the superlattice (382) and the coarse scale valence band level in the superlattice (381).

FIG. 3(b) shows schematically the superlattice of FIG. 3(a) in an applied electric field. Two short dash lines show schematically coarse scale potentials for electrons and holes. The exact profiles of the conduction band and the valence band are shown by the solid lines (321) and (322), respectively, The corresponding coarse scale profile for the electron (371) form a triangular potential well for electrons, in which the electron wave function (323) is confined. The coarse scale profile for the hole (372) form an effective triangular potential for holes, in which the hole wave function (324) is localized. Due to localization of both electron and hole close to the interface (319) between two superlattices (381) and (382) the electron and hole wave functions are attracted to each other which is illustrated by a diagonal line (327) showing a significantly smaller separation between the electron and the hole than in the absence of the electric field (compare with (317) in FIG. 3(a)). The overlap between the electron and hole wave functions is dramatically increased, thus increasing the exciton absorption peak. Further, the localization of electrons and holes in triangular potentials results in a shift of the single-particle electron level (325) upwards from the bottom of the coarse-scale conduction band profile (371) as well as in a shift of the single-particle hole level (326) downwards from the top of the coarse-scale valence band profile (372). This increases also the transition energy (328) resulting in a shift of the exciton peak absorption towards higher photon energies (so called blue shift) with respect to the transition energy (318) in the absence of the electric field.

FIG. 3(c) repeats coarse-scale features of FIG. 3(a) showing coarse-scale profiles of the conduction band and the valence band in zero electric field as well as coarse scale profiles of the electron and hole wave functions demonstrating nearly zero overlap.

FIG. 3(d) repeats coarse-scale features of FIG. 3(b) showing coarse-scale profiles of the conduction band and the valence band in an applied non-zero electric field as well as coarse scale profiles of the electron and hole wave functions demonstrating a dramatically increased overlap.

FIG. 4(a) shows schematically an electrooptic medium according to yet another embodiment of the present invention. A layered structure (410) sandwiched between two barriers comprises a first, thin layer (441) and a second, thick layer (442) wherein the thickness of the second layer exceeds the thickness of the first layer, preferably, at least by a factor of three. The conduction band profile (411) and the valence band profile (412) indicate that the first layer (441) forms a potential well for the holes and a potential barrier for the electrons, whereas the second layer (442) forms potential wells for both electrons and holes. Thus, the heterojunction between the barrier and the first layer and the heterojunction between the first layer and the second layer are type-II heterojunctions. In zero electric field, the hole wave function (414) is confined in the first layer (441), whereas the electron wave function (413) is spread over the entire thick second layer (442). The center of the electron density and the center of the hole density are far off separated from each other which is illustrated by the diagonal line (417). Thus, the electron and the hole wave functions have a zero or a very small overlap. Therefore, the exciton absorption peak in the zero electric field is also very weak. The single particle electron energy level is shown by the dashed line (415), whereas the dashed line (416) refers to the single particle hole energy, and (418) shows the transition energy.

FIG. 4(b) shows schematically the electrooptic medium of FIG. 4(a) in an applied non-zero electric field. The electric field affects the potential profiles for electron (421) and holes (422) in such a way that the electron wave function (423) is squeezed to the heterojunction (449) between the first layer (441) and the second layer (442), whereas the hole wave function (424) remains nearly unaffected and confined in a thin first layer (441). The spatial separation between the centers of the electron wave function (423) and the hole wave function (424) is strongly reduced which is illustrated by the diagonal line (427). The tail of the electron wave function in the first layer is enhanced. The electron density in the second layer close to the heterojunction is enhanced, too. Therefore, the overlap between the electron and the hole wave functions is strongly enhanced in an applied electric field. This leads to a strong enhancement in the exciton absorption peak, and thus, to a strong enhancement in the electrooptic effect. Further, as the spatial size of the hole wave function (424) is rather small, the single particle hole energy (426) is only slightly changed with respect to its value in the zero electric field (416). At the same time, the formation of the triangular potential well for electrons results in a larger shift of the single particle electron level towards higher (425) energies. Therefore, applying an electric field results in a larger transition energy (428) compared to the transition energy in the zero electric field illustrated by (418), i.e. applying an electric field results in a so called blue shift.

FIG. 4(c) shows schematically an electrooptic medium according to a further embodiment of the present invention. A layered structure (460) is sandwiched between two barriers comprises two layers. A first layer (491) is a thin layer, and a second layer is a thick layer (492), wherein the thickness of the second layer exceeds the thickness of the first layer preferably, at least by a factor of three. Both the first layer (491) and the second layer (492) form potential wells for both electrons and holes, which is illustrated by the conduction band profile (461) and the valence band profile (462). Thus, all heterojunctions are type-I heterojunctions. However, because of a strong difference in effective masses between electron and heavy hole, the spatial profiles of the electron wave function (463) and hole wave function (464) are very different. The heavy hole has a large effective mass, and is therefore efficiently localized in the deepest potential well for the holes, i.e. in the first layer (491). The hole wave function (464) is confined in the first layer, and only weakly penetrates into the second layer. On the contrary, the electron has a small effective mass, and the thin first layer (491) is effectively a thin asymmetric potential, which is not capable to confine the electron. The electron wave function (463) is spread over both the first (491) and the second (492) layers, and only a small part of the electron density is located in the first layer. The centers of the electron and the hole wave functions are far apart from each other which is illustrated by the diagonal line (467). Therefore, the overlap between the electron and hole wave functions is very small, leading also to a weak exciton absorption peak. The single particle electron energy level is shown by the dashed line (465), whereas the dashed line (466) refers to the single particle hole energy, and (468) shows the transition energy.

It should be noted that the above described behavior of the electron and hole wave functions is valid, if the effective mass of the heavy hole is significantly larger that the effective mass of the electron. The masses should differ preferably at least by a factor of three.

FIG. 4(d) shows schematically the electrooptic medium of FIG. 4(c) in a non-zero applied electric field. The electric field affects the potential profiles for electron (471) and holes (472) in such a way that the electron wave function (473) is squeezed to the heterojunction (499) between the first and the second layers, whereas the hole wave function (474) remains nearly unaffected and confined in a thin first layer (491). The spatial separation between the centers of the electron and hole wave functions is strongly reduced which is illustrated by a diagonal line (477). The tail of the electron wave function in the first layer is enhanced. The electron density in the second layer close to the heterojunction (499) is enhanced, too. Therefore, the overlap between the electron and the hole wave functions is strongly enhanced in an applied electric field. This leads to a strong enhancement in the exciton absorption peak, and thus, to a strong enhancement in the electrooptic effect. Further, as the spatial size of the hole wave function (474) is rather small, the single particle hole energy (476) is only slightly changed with respect to its value in the zero electric field (466). At the same time, the formation of the triangular potential well for electrons results in a larger shift of the single particle electron level towards higher (475) energies. Therefore, applying an electric field results in a larger transition energy (478) compared to the transition energy in the zero electric field illustrated by (468), i.e. applying an electric field in a so called blue shift of the absorption spectrum. In semiconductor materials, where the electron effective mass is large and the hole effective mass is small, a similar approach is possible, where an electrooptic medium comprises a thin or an ultrathin layer localizing electrons and a thick layer localizing holes.

Figure 4:
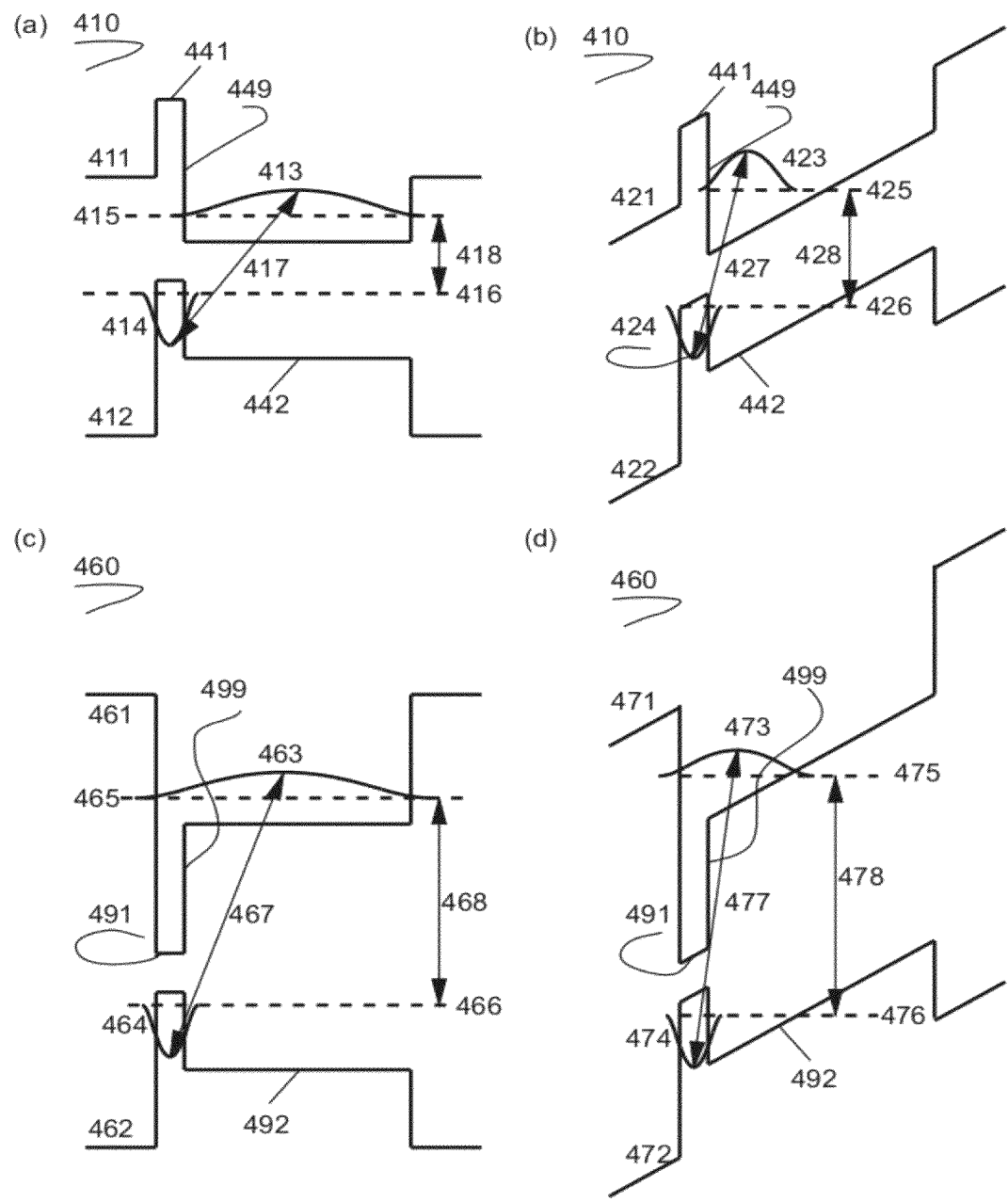
FIG. 4(a). Schematic diagram of a heterostructure comprising a thin layer localizing holes and a thick layer localizing electrons showing a very small overlap of the electron and hole wave functions in a zero electric field (F=0)
FIG. 4(b). Schematic diagram of a heterostructure comprising a thin layer localizing holes and a thick layer localizing electrons showing an increased overlap of the electron and hole wave functions in an non-zero electric field (F≠0)
FIG. 4(c). Schematic diagram of a heterostructure comprising a thin layer and a thick layer, wherein all heterojunctions between single layers are type-I heterojunctions, and where, in a zero electric field (F=0) holes are localized in a thick layer, and electrons are predominantly localized in a thick layer, wherein the electron and hole wave functions have a very small overlap, and the heterostructure exhibits properties of an effectively type-II heterostructure.
FIG. 4(d). Schematic diagram of the heterostructure of FIG. 4(c) in an non-zero electric field (F≠0), showing the electron and the hole wave functions squeezed towards each other, thus increasing the overlap.

In yet another embodiment of the present invention, a superlattice can be used instead of a thick layer in FIG. 4(*c*), wherein an average coarse scale profile of the conduction band is close to the energy level of the conduction band of the thick layer in FIG. 4(*c*), and an average coarse scale profile of the valence band is close to the energy level of the valence band of the thick layer. In a further embodiment of the present invention, a thin layer in FIG. 4(*c*) can be realized as a superlattice comprising of ultrathin layer. In another embodiment of the present invention, both the thin layer and the thick layer in FIG. 4(*c*) are realized by superlattices.

Further embodiments of the present invention include electrooptic media comprising graded layers, e. g. semiconductor alloy layers with alloy composition gradient.

Other embodiments include Anti-Stark electrooptic media, comprising not only planar layered structures, including quantum wells, but also quantum wires, quantum dots and any combination thereof. Quantum wires and quantum dots can be formed in epitaxial structures grown on vicinal or high-index substrates, which include, but are not limited to GaAs(311), GaAs(511), GaAs(811), etc.

In yet other embodiments of the present invention quantum wires or quantum dots are formed where a material, lattice-mismatched to the underlying layer, is deposited. In some of the embodiments insertions are introduced having a nominal thickness below one monolayer (so called submonolayer insertions), e. g. InAs submonolayer insertions in GaAs. This results in the formation of flat, typically one monolayer-high quasi-two dimensional insertions of a strained material.

In further embodiments of the present invention, insertions of a lattice-mismatched material with the nominal thickness exceeding one monolayer are introduced, forming three-dimensional islands embedded in a semiconductor matrix.

In all the embodiments of the present invention, the electron and the hole wave functions in a zero electric field are spatially separated, such that a hole is mainly confined in a first spatial region, and an electron is mainly confined in a second spatial region. Preferably, the electron and the hole are localized at the opposite sides of the heterojunction, and the overlap between electron and hole wave functions is very small, preferably below ten per cent.

It is also possible to create the device in any III-V or II-VI or group-IV material systems. The substrates may be GaAs, InP, InAs, GaSb or metamorphic buffer layers. For example, In—Ga—Al—As-based materials can be used on GaAs or InP substrates. In—Ga—Al—P materilals can be grown on GaAs and InP substrates, In—Ga—Al—N alloys can be grown on GaN or sapphire substrates, or Si substrates with (111) surface orientation, or on SiC substrates, etc.

The applications may include high-speed data transfer, sensing, wavelength-tunable devices and the devices can be realized in the edge- or surface-emitting geometry.

In an applied non-zero electric field an electron or a hole or both an electrons and a hole are squeezed towards the heterojunction. This increases the overlap between the electron and hole wave functions. The exciton peak absorption and the refractive index below the resonance increase correspondingly.

Figure 3:
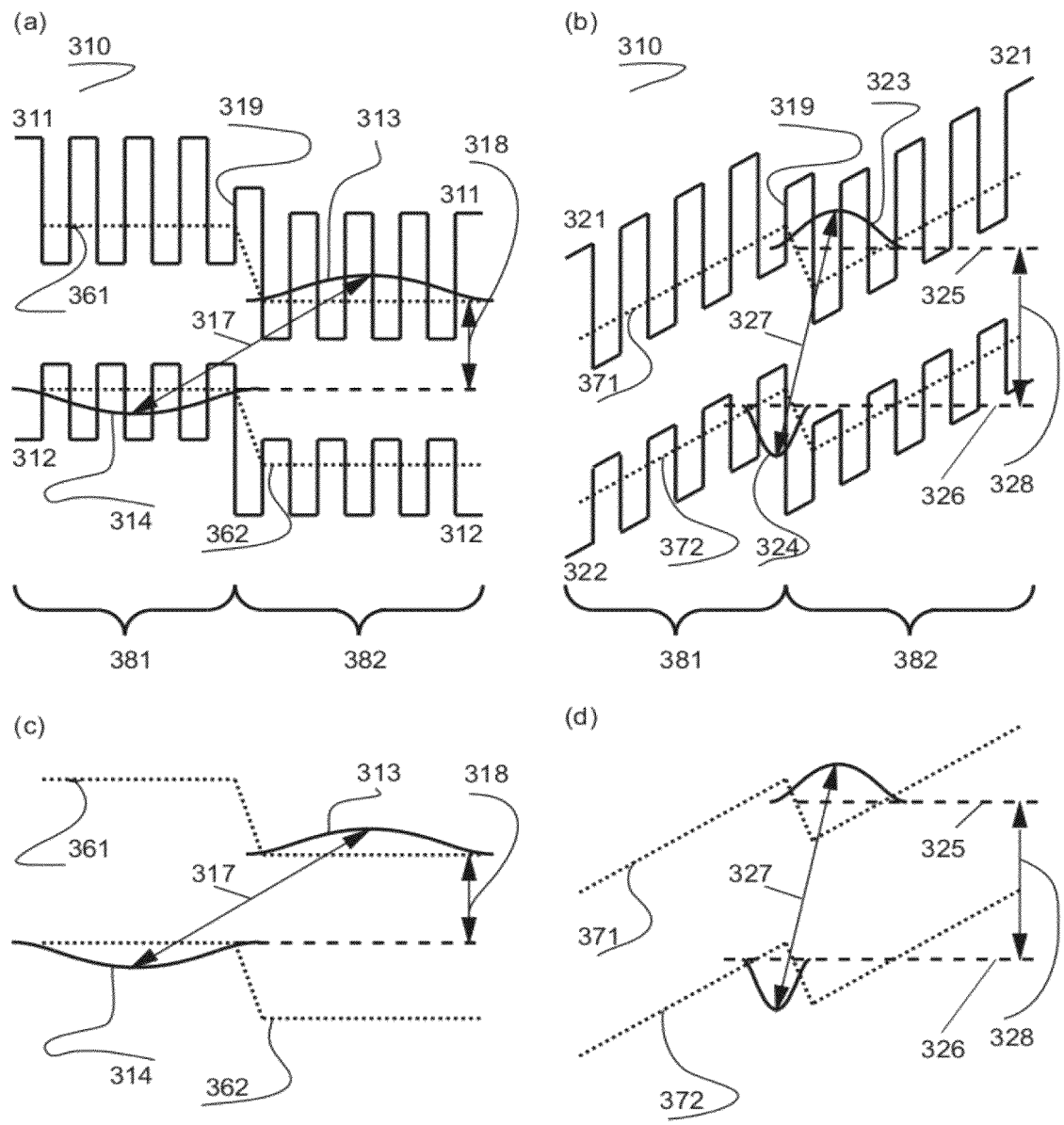
FIG. 3(a). Superlattice comprising only type-I fine scale heterojunctions and realizing an effective type-II heterojunction on a coarse scale, which results in spatially separated confinement of an electron and a hole in the zero electric field (F=0)
FIG. 3(b). Superlattice of FIG. 3(a) in an non-zero electric field (F≠0) showing an increased overlap of the electron and hole wave functions.
FIG. 3(c). Coarse-scale profiles of the conduction band and the valence band for the superlattice of FIG. 3(c) in a zero electric field (F=0) showing an effective type-II heterojunction between two parts of the superlattice.
FIG. 3(d). Coarse scale profiles of the conduction band and the valence band for the superlattice of FIG. 3(a) in an non-zero (F≠0) electric field showing an increased overlap of the electron and hole wave functions.

As illustrated above, an Anti-Stark electrooptic medium can be realized, e.g., by a heterostructure including type-II heterojunctions. Another way to construct an Anti-Stark medium includes engineering of electron and hole wave functions such that they, in a zero electric field, are located in different layers, as shown in the embodiments of FIGS. 3 and 4. Such engineering of the wave functions show that a complex multi-layer medium contains, in fact, an effective type-II heterojunction.

Figure 2:
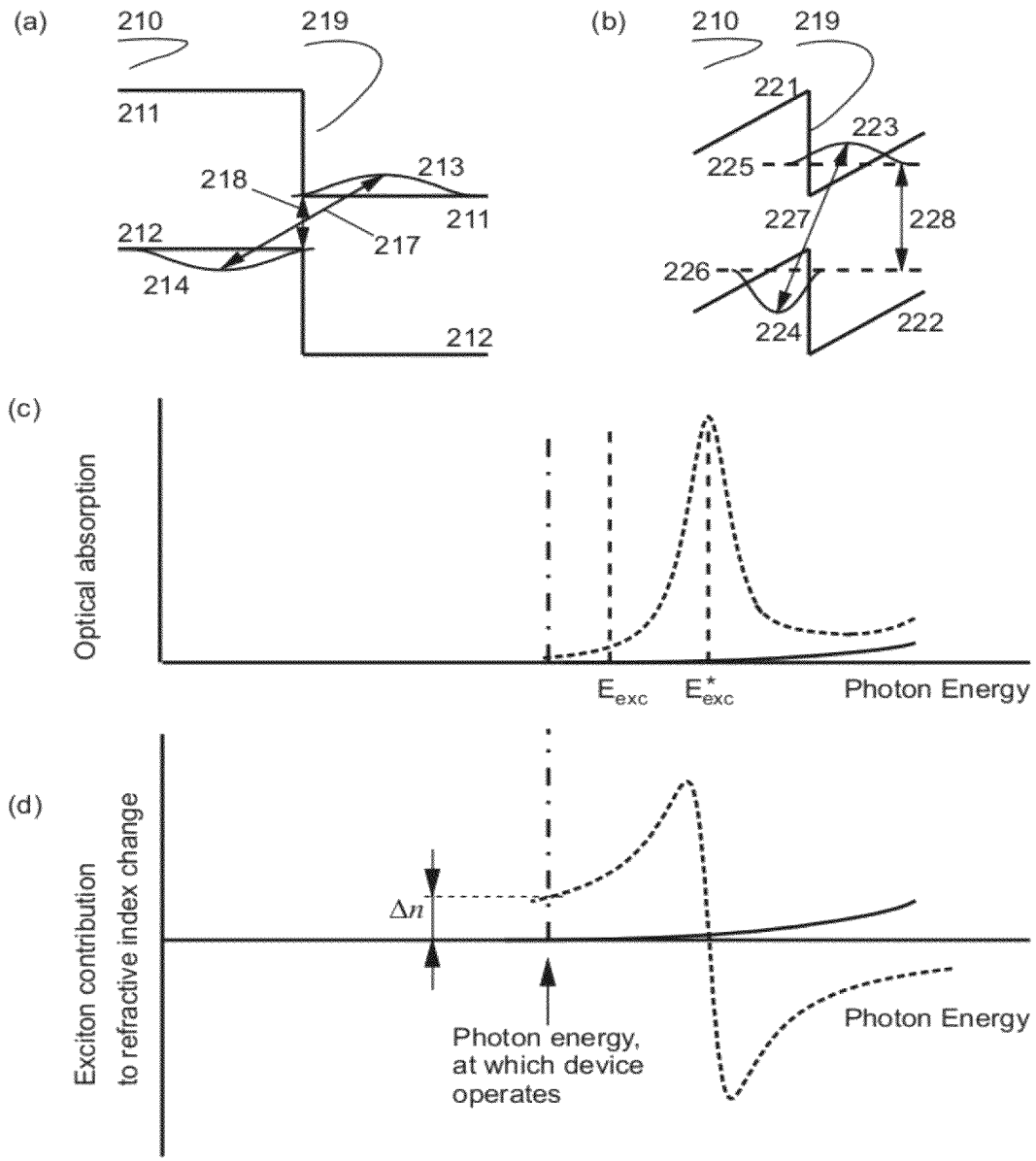
FIG. 2(a). Type-II heterojunction in a zero electric field (F=0), wherein electron and hole wave functions have nearly zero overlap.
FIG. 2(b). Type-II heterojunction in an applied electric field (F≠0), wherein electron and hole wave functions have a strongly increased overlap.
FIG. 2(c). Exciton absorption spectra of a type-II heterojunction of FIG. 2(a) in the zero electric field (solid line) and in an applied non-zero electric field (dashed line). The absorption peak in an electric field is shifted to higher photon energies and the absorption peak is significantly stronger.
FIG. 2(d). Exciton contribution to the refractive index of the type-II heterojunction in the zero electric field (solid line) and in an applied non-zero electric field (dashed line). The feature in an applied electric field is shifted to higher photon energies in an applied electric field and significantly increases. A refractive index change at a fixed photon energy below the exciton absorption peak is shown.

It has been illustrated in the embodiments of FIGS. 2 through 4 that applying an electric field to an Anti-Stark electroptic medium is accompanied by a blue shift of the exciton absorption peak. In further embodiments of the present invention, a zero or even a small red shift can be achieved.

Electrooptically Modulated Optoelectronic Devices Based on an Anti-Stark Electrooptic Medium.

Electroptically Bragg-reflector Stopband-tunable VCSEL Modulating the Intensity of the Output Light Electrooptically Bragg-reflector stopband-tunable VCSEL was disclosed in our commonly assigned, copending patent application U.S. Ser. No. 11/453,979, entitled "Electrooptically Bragg-Reflector Stopband-Tunable Optoelectronic Device For High-Speed Data Transfer", filed Jun. 16, 2006, which is herewith incorporated by reference.

FIG. 5(*a*) shows a schematic diagram of an electroopticaly Bragg-reflector stopband-tunable vertical cavity surface-emitting laser (VCSEL) (600), according to a preferred embodiment of the present invention.

The device (600) is grown epitaxially on a substrate (601) and comprises a bottom distributed Bragg reflector (DBR) (622), a cavity (623), and a top DBR (660). The top DBR (660) further comprises a first part (661), a second part (662), and a third part (663).

The device (600) operates as follows. Light is generated by the active region (626), when a forward bias (613) is applied. Generated light is bounced in the cavity (623) between the bottom DBR (622) and the top DBR (660). The gain overcomes losses for a vertical optical mode, and laser light in the vertical mode comes out (635) through the top DBR (660).

The second part (662) of the top DBR is a modulator. By varying a voltage applied to a modulator, its refractive index changes. The stopband of the top DBR (660) then shifts towards the wavelength of the generated laser light, and prevents its penetration through the top DBR (660) to the ambient medium, e.g. to the air. Thus, the output intensity of the device is modulated. Thus, the device operates as an electronically wavelength tunable DBR stopband edge vertical cavity surface emitting laser providing output laser light modulated in intensity.

The device (600) is grown epitaxially preferably on a p-doped substrate (601) and comprises a first, or bottom DBR (622), which is preferably p-doped, the cavity (623), and a second, or top DBR (660). The top DBR (660) preferably comprises a first part (661), which is preferably n-doped, a second part (662), which is preferably undoped, and a third part (663), which is preferably p-doped. The cavity (623), which operates as a light generating element preferably includes a weakly p-doped or an undoped layer (625), an active region (626), and a weakly n-doped or an undoped layer (627).

The active region (626) is formed of any insertion or combinations of insertions, including a double heterostructure, a quantum well, an array of quantum wires, and arrays of quantum dots, or any combination thereof. The active region generates light, when a forward bias (613) is applied via the p-contact (611) and the n-contact (612). In this embodiment, a current spreading n-layer is formed (672) between the first part (661) of the top DBR (660) and the second part (662) of the top DBR (660). Current apertures (624) are introduced between the bottom DBR (622) and the light generating element (623), and between the light generating element (623) and the top DBR (660).

The second part (662) of the top DBR (660) operates as a modulator element. A reverse bias (693) is applied to the undoped part (662) of the top DBR (660) via the n-contact (612) and the p-contact (691). The p-contact (691) is mounted on a contact layer (673). The modulator element preferably includes a single or multiple quantum insertions (665), which can be a single or multiple quantum wells, a single or multiple layers of quantum wires, a single or multiple layers of quantum dots, or any combination thereof.

The modulator element of each embodiment of the present invention includes at least one quantum insertion which exhibits an Anti-Stark effect in an applied electric field. Preferably, all quantum insertions (665) in the device (600) are selected as Anti-Stark quantum insertions.

The substrate (601) is preferably formed from any III-V semiconductor material or III-V semiconductor alloy, e.g. GaAs, InP, GaSb. GaAs or InP are preferably used depending on the desired emitted wavelength of laser radiation. Alternatively, sapphire, SiC or Si(111) may be used as substrates for GaN-based lasers, i.e. laser structures the layers of which are formed of GaN, AlN, InN, or alloys of these materials. The substrate (601) is doped by a p-type, or acceptor impurity. Possible acceptor impurities include, but are not limited to, Be, Mg, Zn, Cd, Pb, Mn and amphoteric impurities like Si, Ge, Sn where the latter are introduced under such technological conditions that they are incorporated predominantly into the anion sublattice and serve as acceptor impurities.

The first distributed Bragg reflector (622) preferably includes a periodic structure of layers, transparent for the generated laser light, having alternating high and low refractive indices and is p-doped. The layers are formed of the materials preferably lattice-matched or nearly lattice-matched to the substrate. In a GaAs-based device, the layers of the first distributed Bragg reflector are preferably formed of GaAs and GaAlAs, or of layers of GaAlAs with alternating Al content.

The light generating element (623) preferably includes an undoped or a weakly p-doped layer (625), an active region (626), and an undoped or weakly n-doped layer (627). Layers are formed of materials, lattice-matched or nearly lattice-matched to the substrate, and transparent to the generated laser light.

Oxide apertures (624) are preferably introduced to define the current path.

The active region (626) is formed of any insertion or combinations of insertions, including a double heterostructure, a quantum well, an array of quantum wires, and arrays of quantum dots, or any combination thereof. The energy band gap of the insertions is preferably narrower than the energy band gap of the semiconductor materials forming the bottom DBR (622), the layers (625) and (627) of the cavity and the top DBR (660). The active region (626) generates light, when a forward bias (613) is applied.

For structures grown on a GaAs substrate, materials for the active region include, but are not limited to, GaAs, InGaAs, GaAsSb, GaAsP, GaAlAs, InGaAsN, and InGaAsNSb. For structures grown on sapphire, SiC, or Si(111), materials for the active region include, but are not limited to, InGaN, InGaAlN, and InGaAlNAs. For structures grown on InP, materials for the active region include, but are not limited to, InGaAs, InGaAlAs, InGaAsSb, InGaAsP, and InGaAsN.

A forward bias (613) is applied via a first contact (611) (a p-contact) and a second contact (612) (an n-contact). The contacts and are preferably formed from the multi-layered metal structures. The n-contact (612) is preferably formed from the structures including, but not limited to, the structure Ni—Au—Ge. The p-contact (611) is preferably formed from structures including, but not limited to, the structure Ti—Pt—Au.

The first part (661) of the second distributed Bragg reflector (660) preferably includes a periodic structure of layers, transparent for the generated laser light, having alternating high and low refractive indices and is doped by an n-type, or donor impurity. Possible donor impurities include, but are not limited to, S, Se, Te, and amphoteric impurities like Si, Ge, Sn where the latter are introduced under such technological conditions that they are incorporated predominantly into the cation sublattice and serve as donor impurities.

The n-contact (612) is an intracavity contact. It is preferably mounted on a current spreading n-layer (672). The current spreading n-layer (672) is preferably formed of a material lattice-matched or nearly lattice-matched to the substrate, transparent to the generated laser light and n-doped, i.e. doped by a donor impurity.

The modulator, or the second part (662) of the top DBR (660) is preferably undoped or weakly doped. Then the voltage provided by the reverse bias (693) is applied to the modulator (662). The insertions (665) placed in the second part (662) of the top DBR (660) are preferably Anti-Stark insertions that are described above in the embodiments of FIGS. (2) through (4).

The third part (663) of the second distributed Bragg reflector (660) preferably includes a periodic structure of layers, transparent for the generated laser light, having alternating high and low refractive indices and is doped by a p-type, or acceptor impurity.

The top contact (691) is a p-contact mounted preferably on a current spreading p-layer (673). The current spreading p-layer (673) is preferably formed of a material lattice-matched or nearly lattice-matched to the substrate, transparent to the generated laser light and p-doped, i.e. doped by an acceptor impurity.

All insertions (665) in the modulator (662) are preferably selected as Anti-Stark insertions, which allows to maximize electrooptic effect.

Figure 5A:
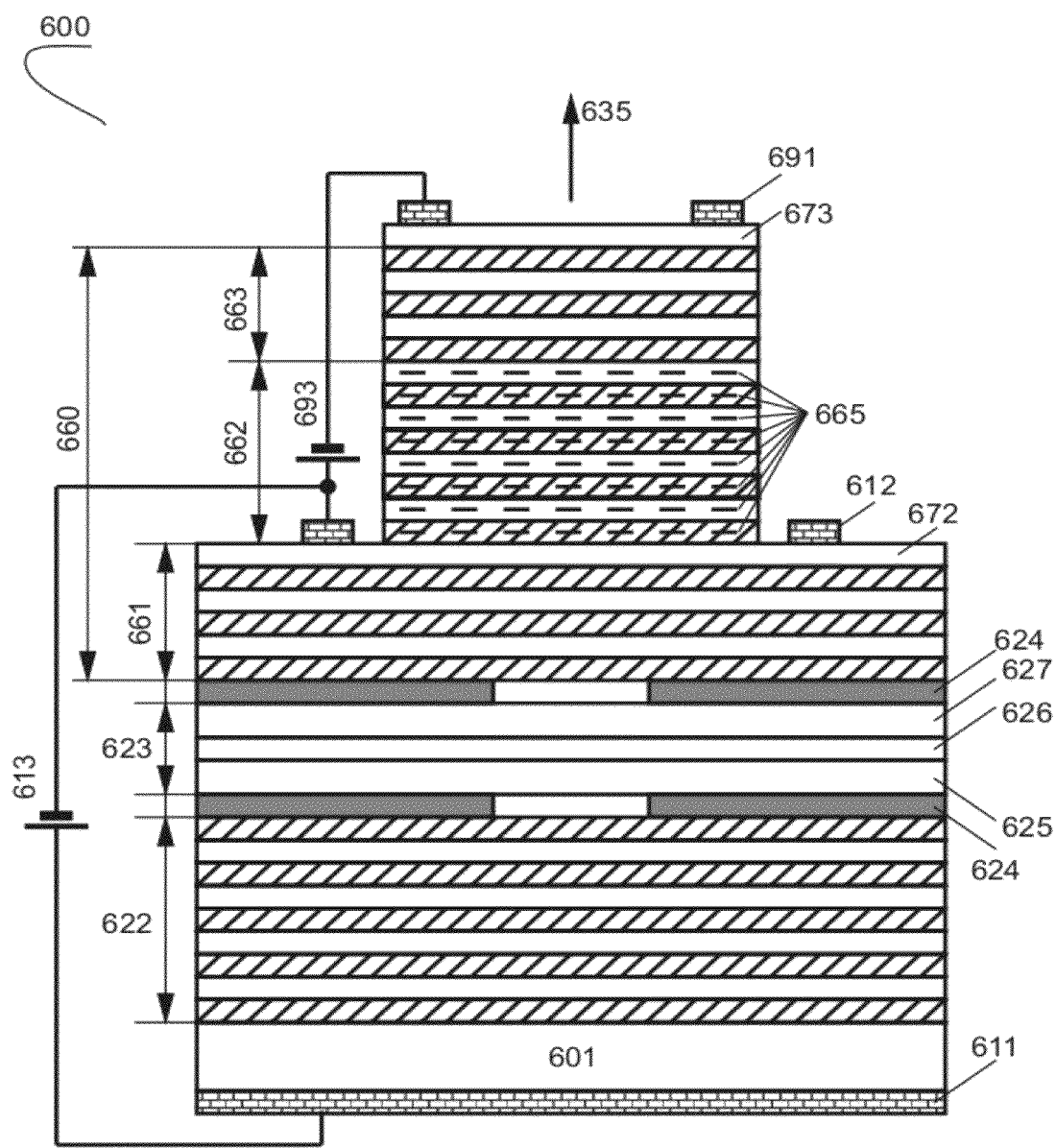
FIG. 5(a). Schematic diagram of an electrooptically Bragg-reflector stopband-tunable vertical cavity surface set for an ultrafast modulation of the output light intensity, according to an embodiment of the present invention.
Figure 6:
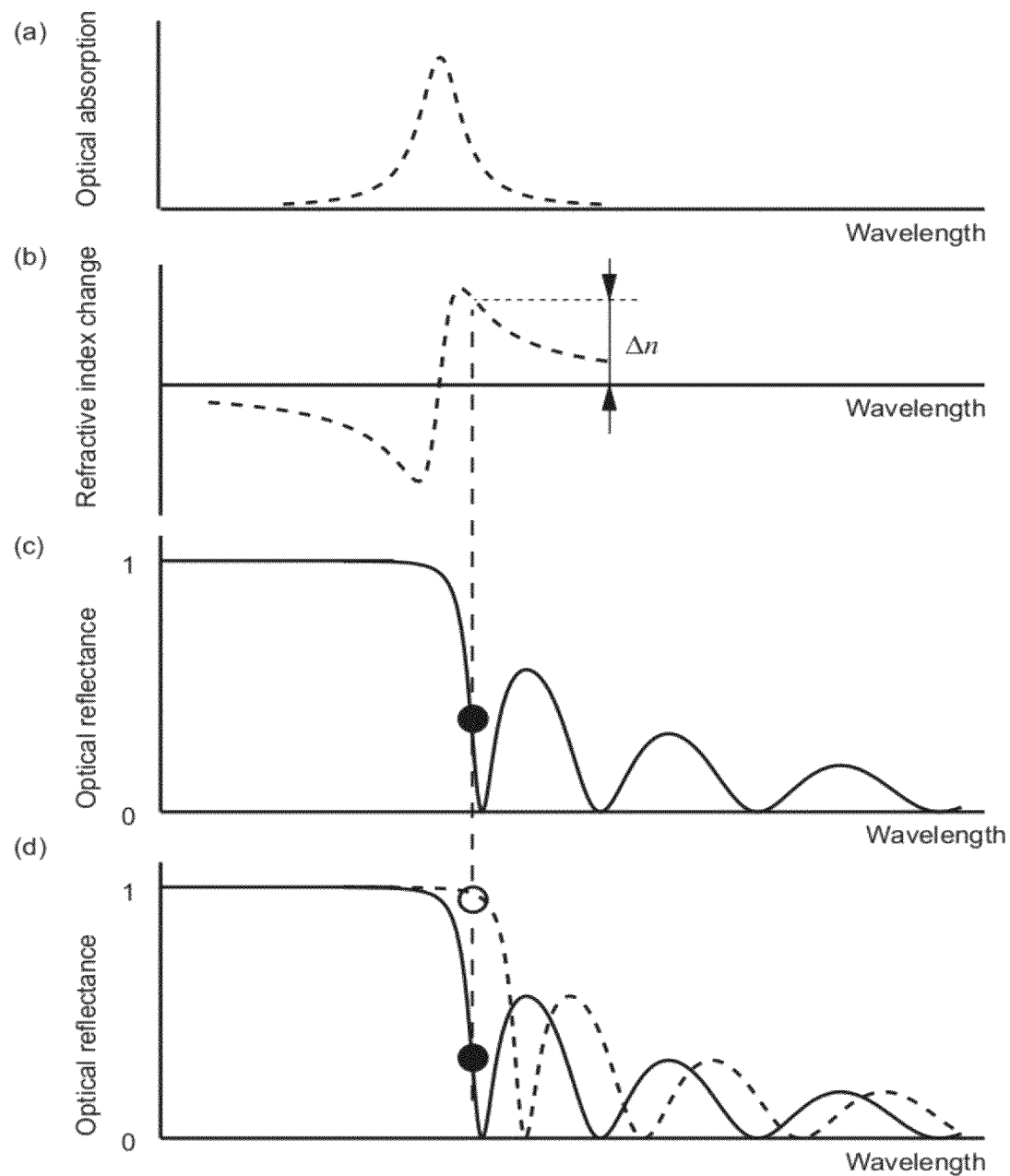
FIG. 6(a). Schematic representation of the optical absorption spectrum of the resonantly absorbing element incorporated into a modulator section of the Bragg reflector at a zero bias (solid line) and at a reverse bias (dashed line). Anti-Stark effect causes an increase of the absorption peak and a small blue shift of the absorption maximum.
FIG. 6(b). Schematic representation of the refractive index change of the resonantly absorbing element incorporated into a modulator section of the Bragg reflector at a zero bias (solid line) and at a reverse bias (dashed line). Anti-Stark effect causes a significant increase of the refractive index on the long wavelength side from the absorption peak.
FIG. 6(c). Optical reflectivity spectrum of a stopband-tunable Bragg reflector at a zero bias applied to the modulator section.
FIG. 6(d). Optical reflectivity spectrum of a stopband-tunable Bragg reflector at a zero bias (solid line) and at a reverse bias (dashed line) applied to the modulator section. For a selected wavelength, applying a zero bias to the modulator section, results in a smaller transparency of the Bragg reflector.

FIG. 6 illustrates the principles of the operation of the electronically wavelength tunable vertical cavity surface emitting laser of FIG. 5(a). FIG. 6(a) shows schematically the optical absorption peak in an applied electric field, which appears due to the Anti-Stark effect, whereas a negligibly small absorption in a zero electric field is not shown. FIG. 6(a) reproduces the basics of FIG. 2(c), but the absorption coefficient is plotted now versus the wavelength. Due to Kramers-Kronig relationship between the real and imaginary parts of the dielectric function of the medium, the emerged absorption peak results in a modulation of the refractive index of the modulator, as it is shown in FIG. 6(b). The modulation of the refractive index of the modulator leads to a shift of the stopband edge wavelength of the modulator-DBR section from position depicted in FIG. 6(c) to the position in FIG. 6(d), dashed line. This shift results in suppression of the modulator transparency, and, thus, in a lower output power of the device.

A stronger electrooptic effect provided by an Anti-Stark medium as compared to the conventional electrooptic medium based on Quantum Confined Stark Effect has numerous advantages.

A stronger electrooptic effect allows operation of the device at a lower constant bias and at a lower modulation amplitude of the bias which is important for numerous applications.

A stronger electrooptic effect allows using lower electric fields and therefore, using a thicker modulator at the same bias, thus reducing the modulator capacitance which enable operation of the device at higher frequencies.

A stronger electrooptic effect ensures a higher robustness of the device against technological tolerances and temperature variations.

The device (600) is a three-contact device, wherein one contact is an intra-cavity contact. In other embodiments of the present invention, two or three contacts can be made intra-cavity, allowing some other parts of the DBRs to be made undoped thus reducing the free carrier absorption losses of light.

Figure 5B:
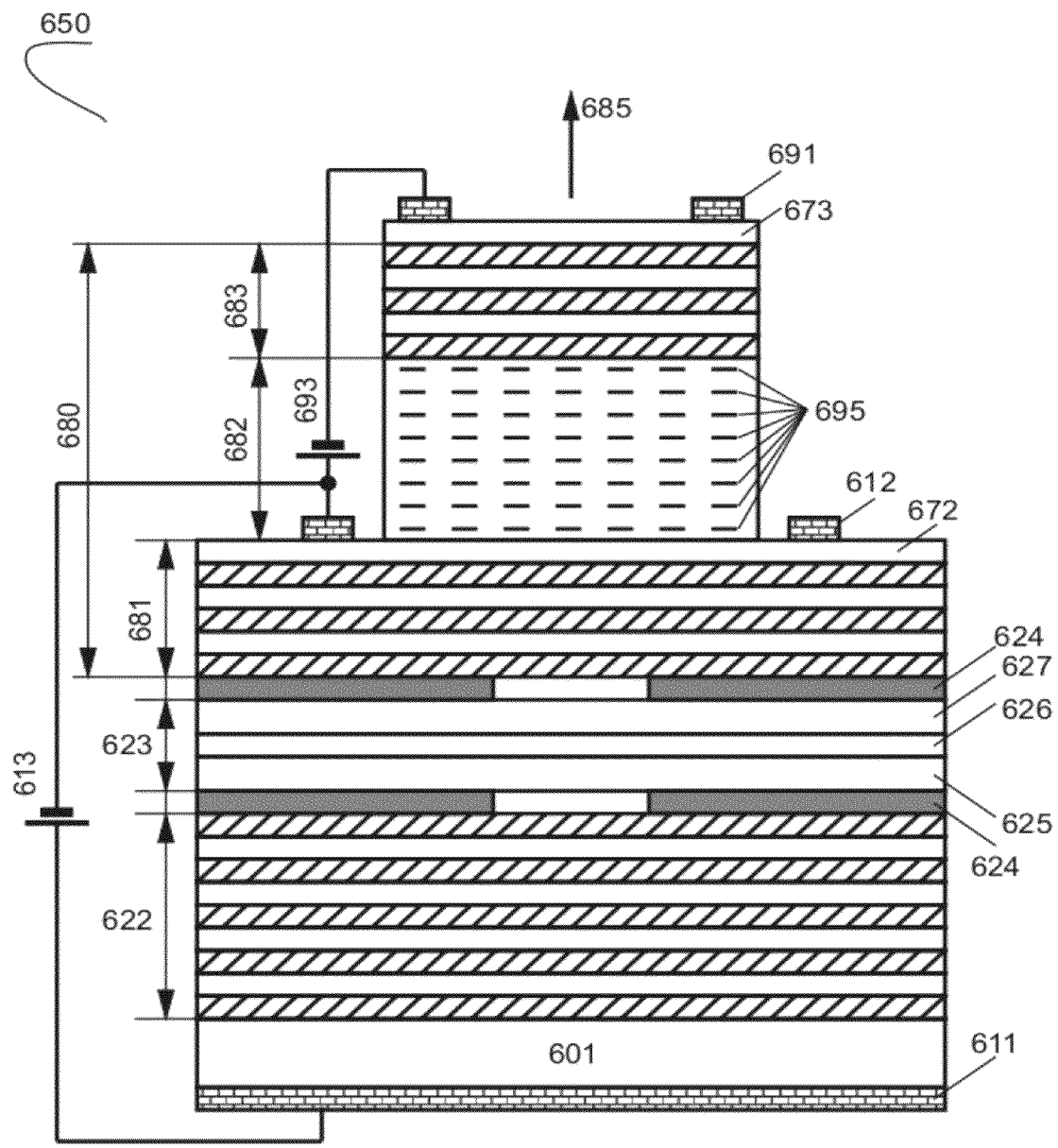
FIG. 5(b). Schematic diagram of an electrooptically Bragg-reflector stopband-tunable vertical cavity surface set for an ultrafast modulation of the output light intensity, according to another embodiment of the present invention.

FIG. 5(b) shows a schematic diagram of an electrooptically Bragg-reflector stopband-tunable vertical cavity surface-emitting laser (VCSEL) (650), according to another embodiment of the present invention.

Alternatively to the embodiment (600) shown in FIG. 5(a), the top DBR (680) of the device (650) comprises a first part (681), which is preferably n-doped, a second part (682) which is preferably undoped, and a third part (683), which is preferably p-doped. The undoped part (682) is modulator element. Alternatively to the modulator element of the embodiment of FIG. 5(a), the modulator element (682) is not a DBR, but a cavity filled with a single or multiple quantum insertions (695), which can be a single or multiple quantum wells, a single or multiple layers of quantum wires, a single or multiple layers of quantum dots, or any combination thereof.

By varying a voltage applied to a modulator (682), its refractive index changes. The stopband of the top DBR (680) is determined by the entire structure of the top DBR. As the stopband of a DBR depends on the adjacent cavity, a refractive index change in the cavity (682) results in a shift of the stopband edge. If the stopband edge shifts towards the wavelength of the generated laser light, this prevents the propagation of light through the top DBR (680) to the ambient medium, e.g. to the air. Thus, the output intensity of the emitted light (685) from the device is modulated. Thus, the device operates as an electronically wavelength tunable DBR stopband edge vertical cavity surface emitting laser providing output laser light modulated in intensity.

Figure 5C:
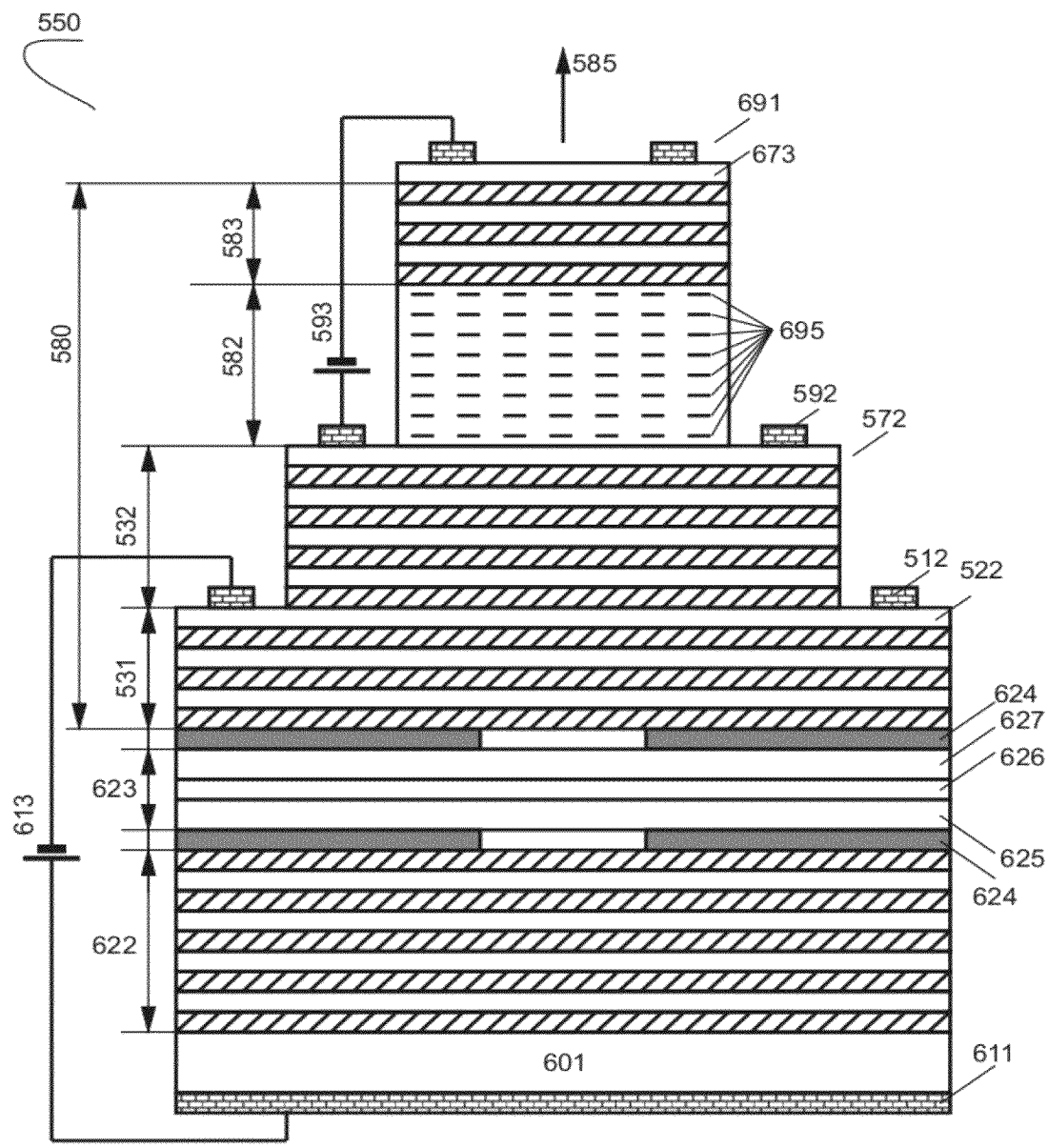
FIG. 5(c). Schematic diagram of an electrooptically Bragg-reflector stopband-tunable vertical cavity surface set for an ultrafast modulation of the output light intensity, according to yet another embodiment of the present invention.

In yet another embodiment, a device can be a four-contact device, having all contacts intra-cavity and allowing all DBRs to be made undoped. A four-contact device may have certain advantages in a complete electrical decoupling of a VCSEL and a modulator section which will prevent from parasitic oscillating voltage being applied to the active region of the VCSEL. FIG. 5(c) shows schematically a four-contact device (550) according to this embodiment.

The top DBR (580) comprises a first part (531) which is preferably n-doped, a second part (532) which is preferably undoped or weakly n-doped, a third part (582) which is preferably undoped and a fourth part (583) which is preferably p-doped. The section (582) is a modulator element.

The device (550) is a four-contact device, wherein two contacts are intracavity contacts. The first intracavity contact (512) is an n-contact preferably mounted on a first n-current spreading layer (522). The second intracavity contact (592) is an n-contact preferably mounted on a second n-current spreading layer (572). A forward bias (613) is applied to the light generating element (623) via the contacts (611) and (612). A modulation voltage (593) which preferably consists of a constant reverse bias and a modulation signal is applied to the main part (582) of the modulator element via the contacts (592) and (691). The light with modulated intensity (585) comes out through the top DBR (580).

In a further embodiment of the present invention, the light comes out through the substrate, and a modulator is placed in the bottom DBR.

In another embodiment of the present invention, the device is grown epitaxially on an n-doped substrate, the doping of all layers and the polarity of contacts is correspondingly reversed.

Figure 7:
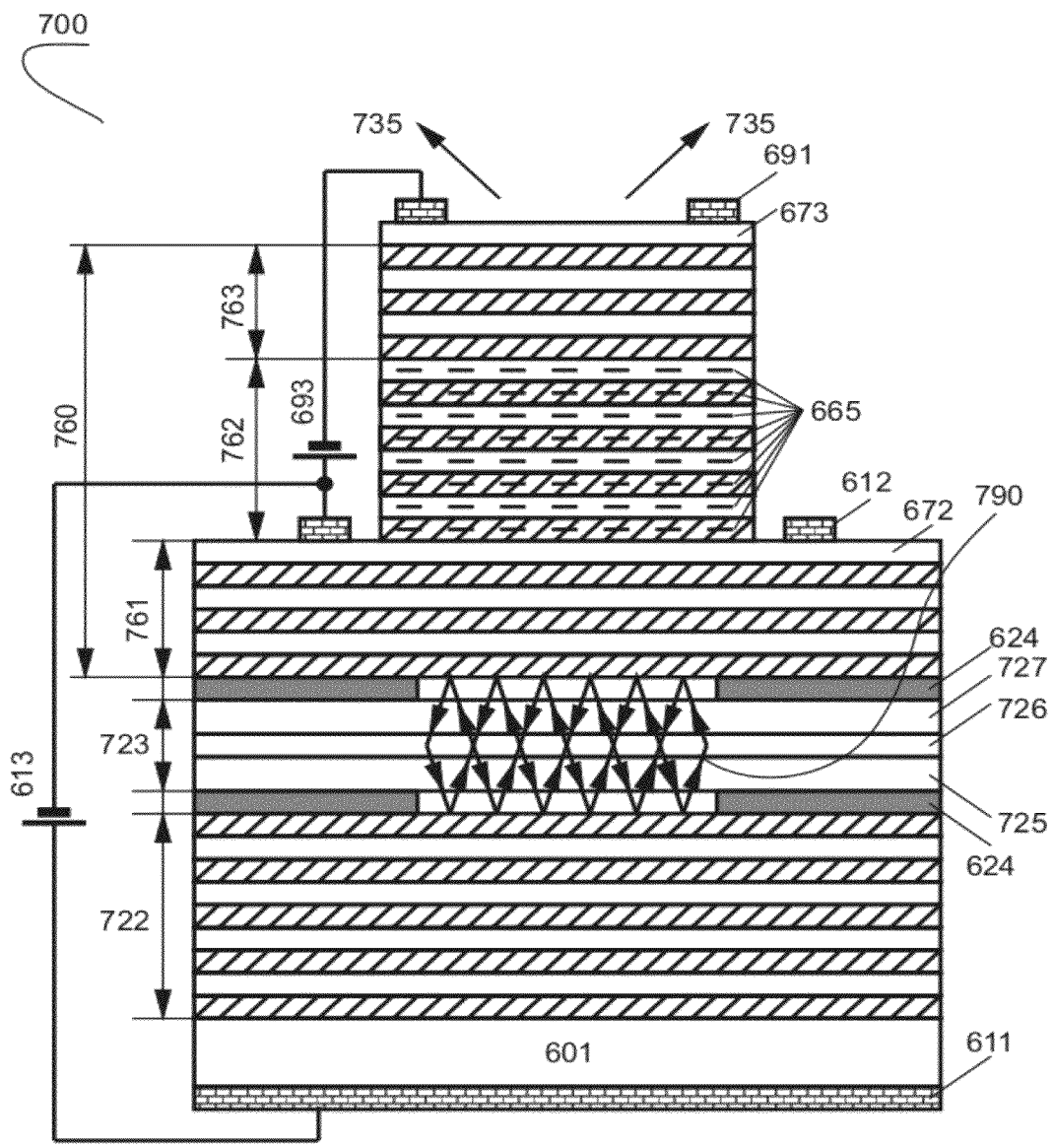
FIG. 7. Schematic diagram of an electrooptically Bragg-reflector stopband-tunable tilted cavity surface set for an ultrafast modulation of the output light intensity, according to another embodiment of the present invention.

Electroptically Bragg-reflector Stopband-tunable Tilted Cavity Surface Emitting Laser Modulating the Intensity of the Output Light In a similar way, a tunable tilted cavity laser can be constructed. FIG. 7 shows a schematic diagram of an electrooptically modulated tilted cavity surface emitting laser (700) according to another embodiment of the present invention. The concept of a tilted cavity laser has been proposed in the U.S. Pat. No. 7,031,360, "Tilted Cavity Semiconductor Laser (Tcsl) and Method of Making Same", issued Aug. 18, 2006, and in the U.S. patent application Ser. No. 10/943,044 "Tilted Cavity Semiconductor Optoelectronic Device and Method of Making Same", filed Sep. 16, 2004, both by the inventors of the present invention, and herein incorporated by reference. The tilted cavity laser, particularly, the tilted cavity surface emitting laser (700) is grown epitaxially on a substrate (601) which is preferably p-doped. The device comprises a first multilayer interference reflector, MIR, (722), which is preferably p-doped, the light generating element, or a tilted cavity (723), and a second, or top MIR (760). The light generating element (723) forms a tilted cavity. The tilted cavity (723), the first MIR (722), and the second MIR (760) are selected such, that among various optical modes, a mode having the minimum leaky losses to the substrate and the contacts is a tilted optical mode (790), in which light within the cavity propagates in a direction tilted with respect to both the p-n junction plane and to the direction normal to the p-n junction plane. Light of the tilted optical mode (790) propagates through the second MIR (760), and comes out of the device as tilted light (735).

The top MIR (760) preferably comprises a first part (761), which is preferably undoped or weakly n-doped, a second part (762), which is preferably undoped, and a third part (763), which is preferably undoped or weakly p-doped. The light generating element (723) preferably includes a weakly p-doped or an undoped layer (725), an active region (726), a weakly n-doped or an undoped layer (727).

The active region (726) is formed of any insertion or combinations of insertions, including a double heterostructure, a quantum well, an array of quantum wires, and arrays of quantum dots, or any combination thereof. The active region generates light, when a forward bias (613) is applied via the first p-contact (611) and the first n-contact (612).

The modulator, or the second part (762) of the top MIR (760) is preferably undoped or weakly doped. Then the voltage provided by the reverse bias (693) is applied to the modulator (762). The insertions (665) placed in the second part (762) of the top MIR (760) are preferably Anti-Stark insertions that are described above in the embodiments of FIGS. (2) through (4).

A stronger electrooptic effect provided by an Anti-Stark medium as compared to the conventional electrooptic medium based on Quantum Confined Stark Effect has numerous advantages, similar to the advantages described in the relation to the embodiment of FIG. 5(*a*).

Figure 8:
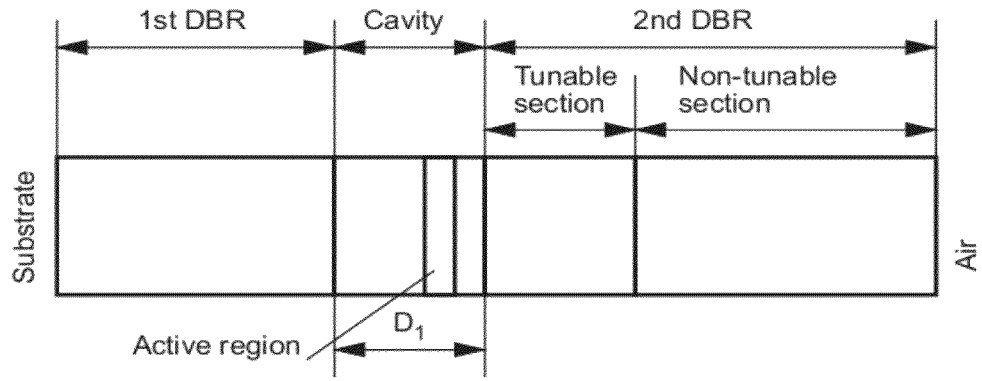
FIGS. 8(a) through 8(d) show schematically the principle of the wavelength tuning in the electrooptically Bragg-reflector stopband tunable vertical cavity surface emitting laser according to yet another embodiment the present invention.
Figure 8:
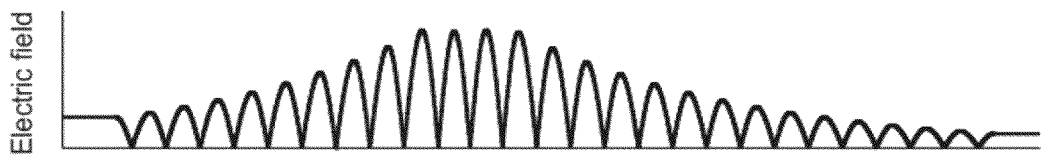
Figure 8:
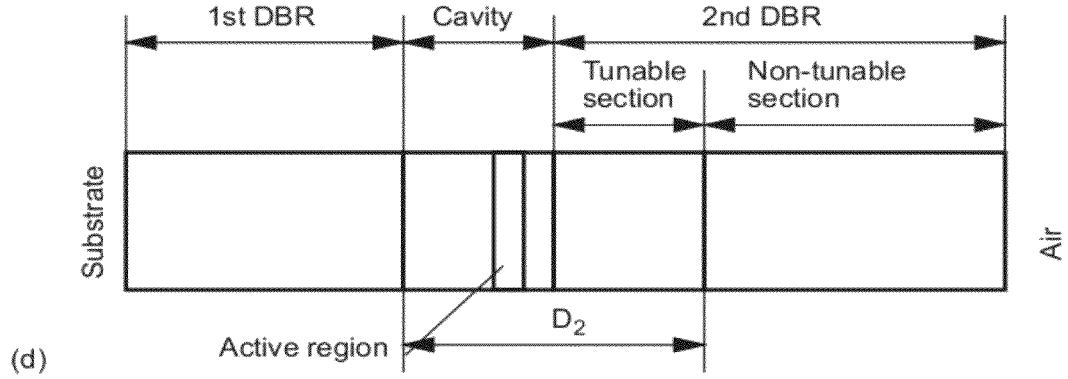
Figure 8:
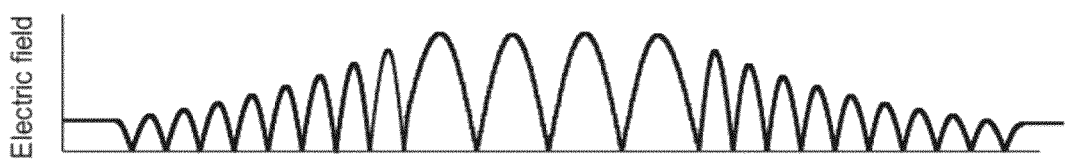

Electroptically Bragg-reflector Stopband-tunable VCSEL Modulating a Wavelength of the Emitted Light FIG. 8 illustrates schematically a possibility to fabricate a wavelength-tunable laser based on an electrooptically modulated distributed Bragg reflector as was disclosed in the U.S. patent application Ser. No. 11/453,979, entitled "Electroptically Bragg-Reflector Stopband-Tunable Optoelectronic Device for High-Speed Data Transfer", filed Jun. 16, 2006, by the inventors of the present invention, and herein incorporated by reference. FIG. 8(*a*) shows schematically main elements of a laser, namely, a first DBR, a cavity with the active region, and a second DBR consisting of a tunable section and a non-tunable section. If the second DBR is switched to a non-transparent state, the wavelength of the emitted laser light is determined by the thickness of the cavity $D_1$. FIG. 8(*b*) illustrates the spatial profile of the resonant optical mode, namely the absolute value of the electric field strength.

FIG. 8(*c*) shows schematically the same device when the second DBR is switched to a transparent state. Then the tunable section of the DBR is transparent and may be qualitatively considered as a part of the cavity. Thus, the device contains an effective cavity with a thickness $D_2 > D_1$, and wavelength of the laser light will be determined by a modified effective thickness of the cavity. FIG. 8(*d*) shows schematically the spatial profile of the resonant optical mode, namely the absolute value of the electric field strength.

When the device modulates the wavelength of the emitted laser light, it is preferred to separate the modulation of the wavelength and the modulation of the intensity, and to avoid the latter. Therefore, for the device of the embodiment schematically illustrated in FIG. 8, it is preferred to choose the first DBR weaker than the second DBR in the transparent state such that the main output of light will occur through the first DBR and the substrate. As the first DBR is not changed when the transparency of the second DBR is modulated, the intensity of the emitted laser light will not be changed. Different positioning of the sections with respect to the substrate is possible and, consequently, both top emitting and bottom emitting devices can be realized.

Figure 9:
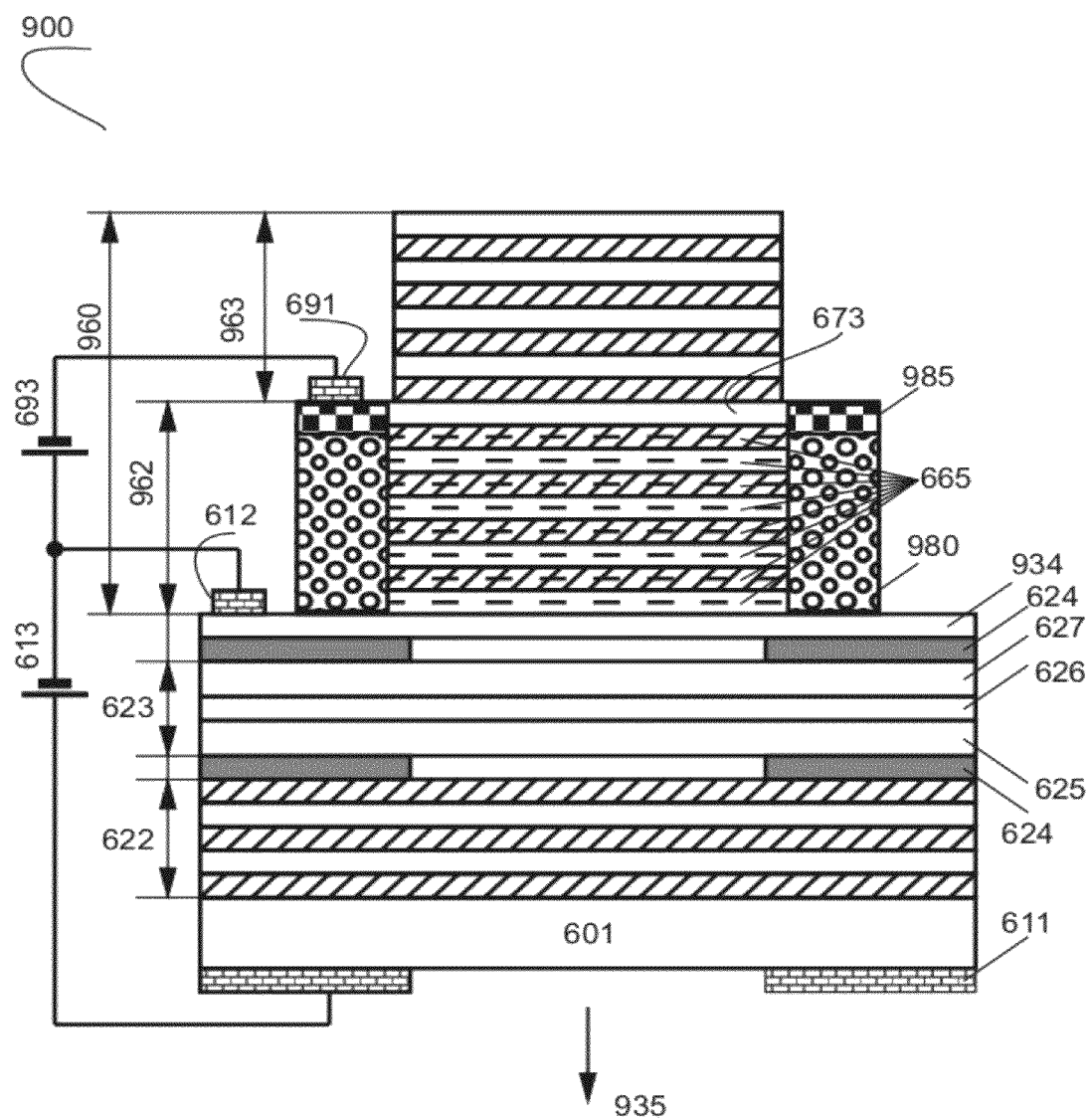
FIG. 9 shows schematically the electrooptically wavelength-modulated surface emitting laser, the principle of operation of which is illustrated in FIGS. 8(a) through 8(d), according to the same embodiment of the present invention.

FIG. 9 shows a schematic diagram of an electronically wavelength-tunable vertical cavity surface emitting laser (900), according to yet another embodiment of the present invention. The operation of the device (900) is illustrated in FIG. 9. The second DBR (960) comprises a tunable section (962) and a non-tunable section (963). Applying bias (693) to the tunable section (962) of the second DBR (960), it is possible to tune the wavelength of the laser light (935) emitted through the substrate.

The region underneath the top p-contact (691) is preferably subject to proton bombardment, which results in the formation of a region (980) with a high concentration of defects and low conductivity. Thus, the region (980) formed of initially n-doped or p-doped regions, will behave as a region of intrinsic, i.e. semi-insulating semiconductor. In order to provide a possibility to apply the bias (693) to the quantum insertions (665) within the modulator element, diffusion of Zn is preferably performed to the region (985) underneath the top p-contact (691). Due to the diffusion of Zn, a part of semi-insulating region transforms in a p-doped highly conducting region, allowing to apply bias from the p-contact (691) to the quantum insertions (665).

A stronger electrooptic effect provided by quantum insertions (665) based on an Anti-Stark medium as compared to the conventional electrooptic medium based on Quantum Confined Stark Effect has numerous advantages, similar as those for the embodiment of FIG. 5(*a*).

Figure 10:
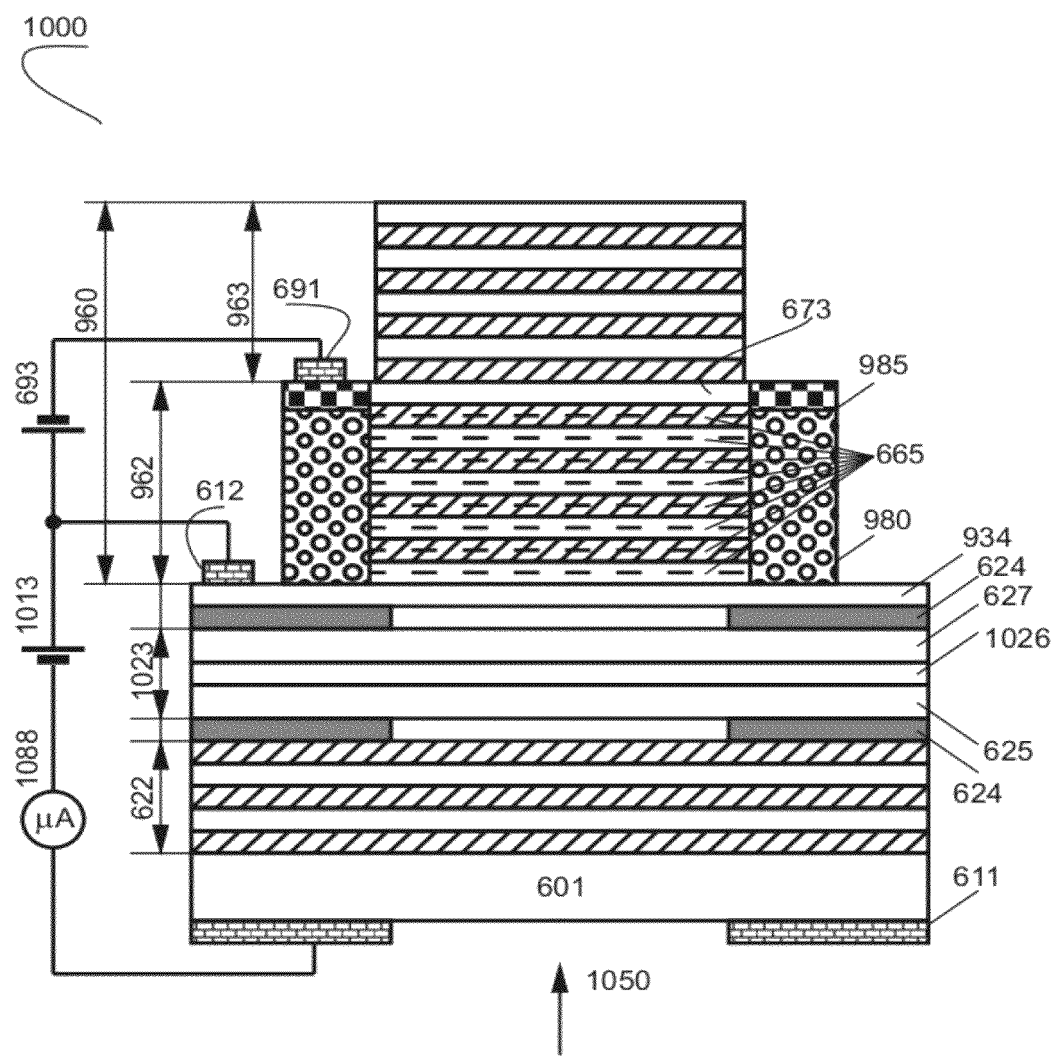
FIG. 10 shows schematically an electrooptically modulated resonant cavity photodetector based on an electrooptically stopband-tunable Bragg reflector, according a further embodiment of the present invention.

Electrooptically Modulated Resonant Cavity Photodetector Based on Electrooptically Tunable Bragg Reflector FIG. 10 shows a schematic diagram of an electronically wavelength-tunable resonant cavity photodetector (1000), according to a further embodiment of the present invention. A zero or reverse bias (1041) is applied to the p-n junction in the active cavity (1023). External light (1050) impinging on the device is absorbed by the p-n junction element (1026) resulting in the generation of electron-hole pairs, and, thus, in the generation of a photocurrent which can be measured by a microampermeter (1080).

The top DBR (960) comprises a tunable section (a modulator) (962) and a non-tunable section (963). Applying bias (693) to the tunable section (962) of the second DBR (960), it is possible to tune the effective length of the cavity and, thus, the resonance wavelength of the resonant cavity photodetector.

A stronger electrooptic effect provided by quantum insertions (665) based on an Anti-Stark medium as compared to the conventional electrooptic medium based on Quantum Confined Stark Effect has numerous advantages, similar as those for the embodiment of FIG. 5(*a*). Using an electrooptic medium having a strong electrooptic effect allows operation of a device at weaker electric fields. Therefore, given the same bias voltage, a device can be selected to have a thicker undoped modulator, which will therefore have a lower capacitance thus allowing a higher cutoff frequency for the device operation. Further advantages include but are not limited to higher temperature robustness as well as higher robustness against technological tolerances.

Figure 11:
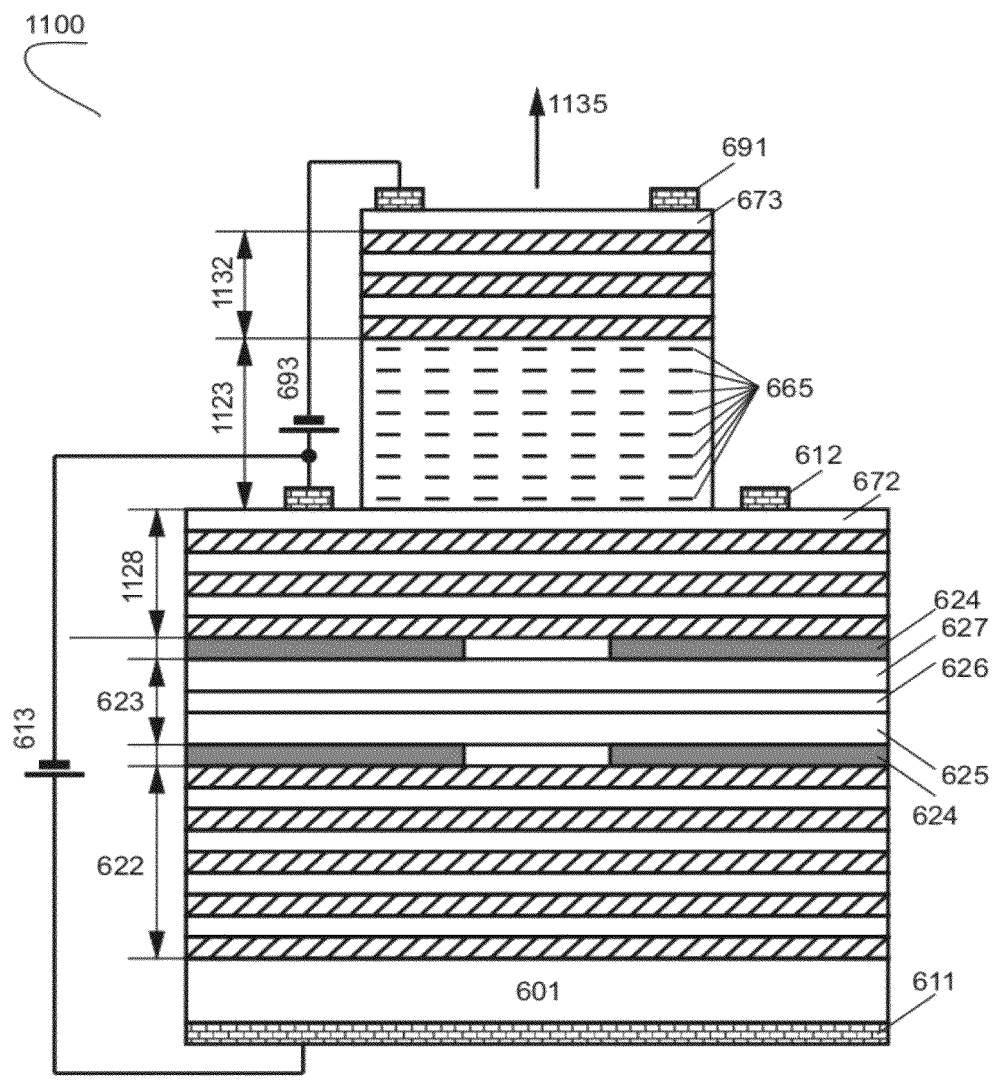
FIG. 11 shows schematically an electrooptically modulated vertical cavity surface emitting laser, based on two coupled cavities and set to provide modulation of the output light intensity, according to another embodiment of the present invention.

Electroptically Modulated VCSEL Based on Two Resonantly Coupled Cavities Modulating the Intensity of the Output Light FIG. 11 shows schematically an electrooptically modulated vertical cavity surface emitting laser (1100) according to another embodiment of the present invention. The electrooptically modulated VCSEL based on two resonating cavities was earlier disclosed in the U.S. patent application Ser. No. 11/144,482 "Electrooptically Wavelength-Tunable Resonant Cavity Optoelectronic Device for High-Speed Data Transfer", filed Jun. 2, 2005, by the inventors of the present invention, which is herein incorporated by a reference. The device (1100) comprises a first DBR (622), a first cavity (623), a second DBR (1128), a second cavity (1123), and a third DBR (1132). A first cavity (623) is an active cavity, further comprising an active region (626) which generates light when a forward bias (613) is applied.

The second cavity (1123) is a modulator cavity, further comprising an electrooptic medium (665). The first cavity (623) and the second cavity (1123) are optically coupled via the second DBR (1128). Applying a bias (693) to the modulator cavity (1123) creates an electric field in the electrooptic medium (665) which changes its refractive index and thus drives the second cavity (1123) into the resonance with the first cavity (623) or out of the resonance. If the two cavities are in resonance, the laser light generated in the first cavity (623), is enhanced in the second cavity (1123) and comes out through the third DBR (1132) at a high intensity. If the two cavities are out of resonance, the light generated in the first cavity (623) comes out at a low intensity. Thus, changing the bias (693) results in the intensity modulation of the output laser light (1135).

A stronger electrooptic effect provided by quantum insertions (665) based on an Anti-Stark medium as compared to the conventional electrooptic medium based on Quantum Confined Stark Effect has a series of important advantages. Using an electrooptic medium having a strong electrooptic effect allows operation of a device at weaker electric fields. Therefore, given the same bias voltage, a device can be selected to have a thicker undoped modulator, which will therefore have a lower capacitance thus allowing a higher cutoff frequency for the device operation. Further advantages include but are not limited to higher temperature robustness as well as higher robustness against technological tolerances.

Electroptically Modulated Wavelength-tunable VCSEL

Figure 12:
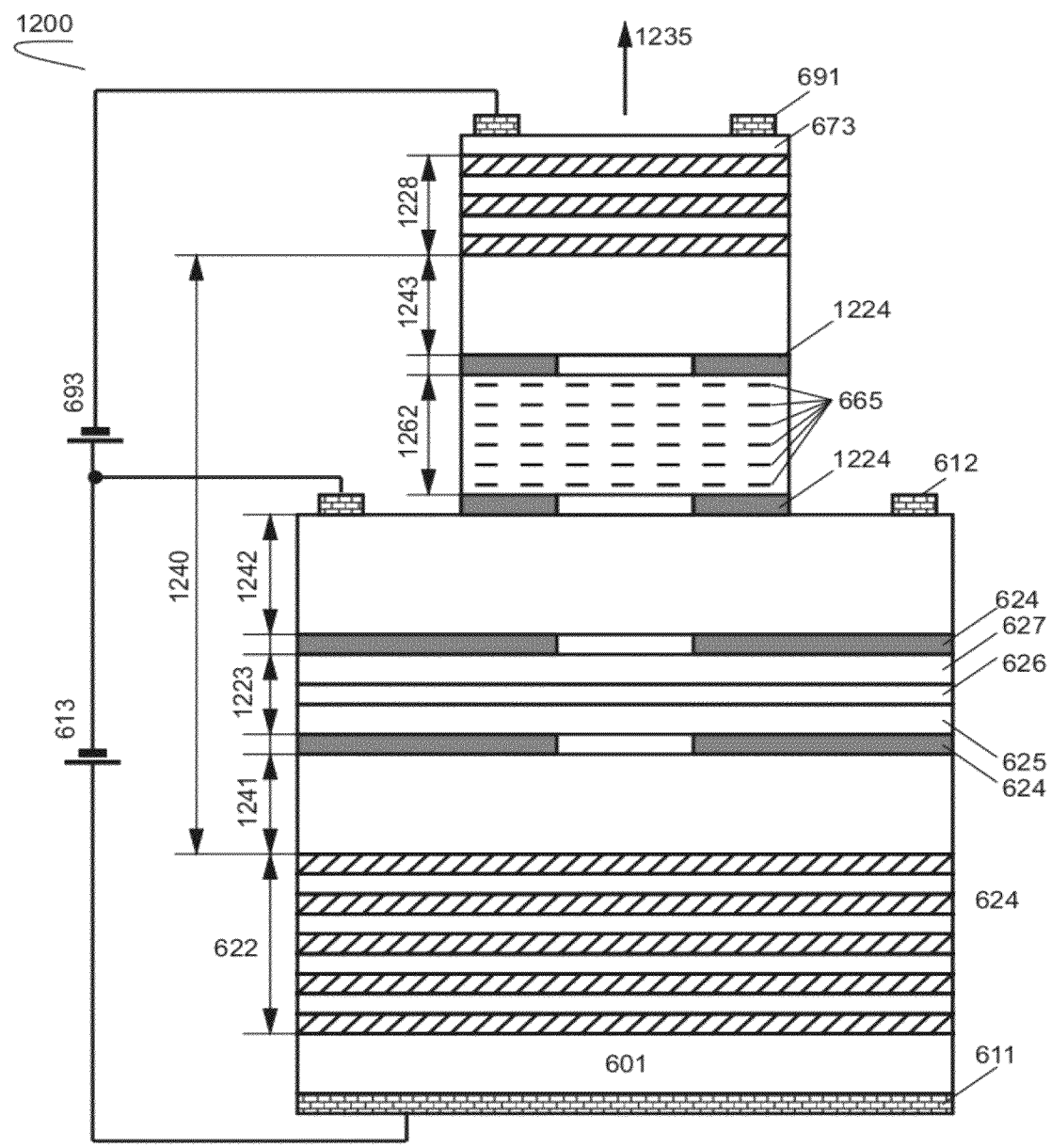
FIG. 12 shows schematically an electrooptically wavelength-tunable vertical cavity surface emitting laser, wherein a modulator element and an active element are placed in the same cavity, according to yet another embodiment of the present invention.

FIG. 12 shows schematically an electrooptically modulated wavelength tunable VCSEL (1200) according to yet another embodiment of the present invention. A wavelength-tunable VCSEL based on electrooptically tuned modulator inside a cavity was disclosed in the U.S. Pat. No. 6,611,539, "Wavelength-Tunable Vertical Cavity Surface Emitting Laser and Method of Making Same", issued Aug. 26, 2003, by the inventors of the present invention, which is herein incorporated by reference. The device (1200) comprises a bottom DBR (622) which is preferably p-doped, a cavity (1240), and a top DBR (1228) which is preferably n-doped. The cavity (1240) further comprises a first optical layer (1241), a light generating element (1223), a second optical layer (1242), a modulator element (1262), and a third optical layer (1243). The optical layers (1241), (1242) and (1243) are selected such that both the active region (626) and the quantum insertions (665) in the modulator element (1262) are preferably positioned in the maxima of the standing wave of the VCSEL optical mode. The first optical layer (1241) is preferably p-doped, the second optical layer (1242) is preferably n-doped, and the third optical layer (1243) is preferably p-doped. The oxide apertures (1224) are preferably introduced between the second optical layer (1242) and the modulator element (1262) and between the modulator element (1262) and the third optical layer (1243).

The device (1200) operates as follows. Applying a bias (693) to the modulator element (662) leads to a refractive index change in the quantum insertions (665). This changes the resonance wavelength of the cavity (1240), and thus, the wavelength of the laser light (1235) coming out of the device.

A stronger electrooptic effect provided by quantum insertions (665) based on an Anti-Stark medium as compared to the conventional electrooptic medium based on Quantum Confined Stark Effect has several important advantages. Using an electrooptic medium having a strong electrooptic effect allows operation of a device at weaker electric fields. Therefore, given the same bias voltage, a device can be selected to have a thicker undoped modulator, which will therefore have a lower capacitance thus allowing a higher cutoff frequency for the device operation. Further advantages include but are not limited to higher temperature robustness as well as higher robustness against technological tolerances.

Electroptically Modulated Wavelength-tunable Resonant Cavity Photodetector

Figure 13:
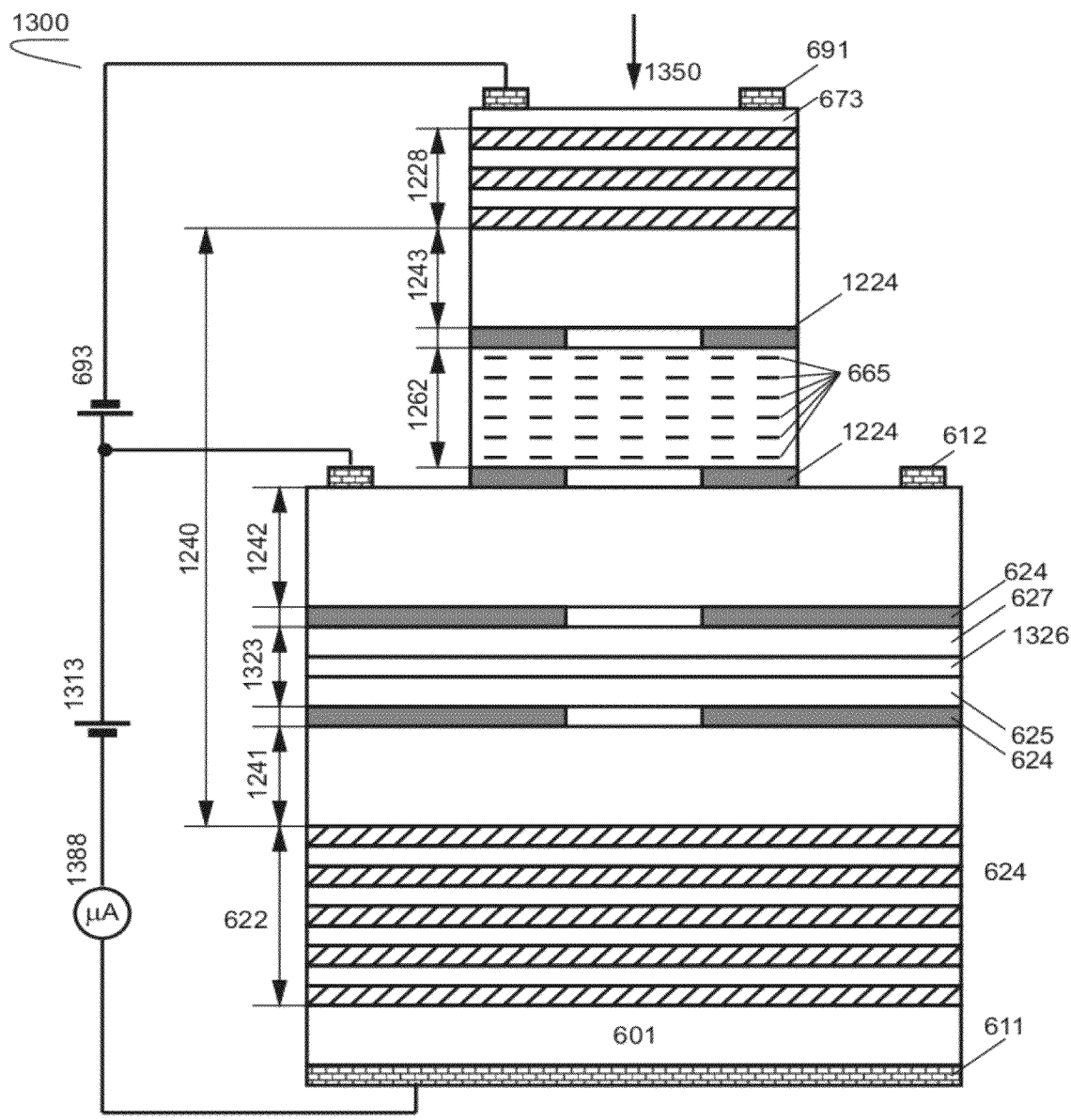
FIG. 13 shows schematically an electrooptically wavelength-tunable resonant cavity photodetector, wherein a modulator element and a current generating element are placed in the same cavity, according to a further embodiment of the present invention.

FIG. 13 shows schematically an electrooptically modulated wavelength-tunable resonant cavity photodetector (1300) according to a further embodiment of the present invention. The device (1300) grown epitaxially on a substrate (601), which is preferably p-doped, comprises a bottom DBR (622), which is preferably p-doped, a resonant cavity (1240), and a top DBR (1228) which is preferably n-doped. The cavity (1240) further comprises a first optical layer (1241), a current generating element (1323), a second optical layer (1242), a modulator element (1262), and a third optical layer (1243). The current generating element operates under zero or reverse bias (1313). Incoming light (1350) impinges on the device (1350), and propagates through the top DBR (1228) to the cavity (1240). The current generating element further comprises a current generating region (1326) which absorbs incoming light generating electron-hole pairs. A reverse bias (1313) creates an electric field in the current generating element (1326), the electric field separates electrons and holes thus generating a photocurrent in an external circuit. The photocurrent is measured by a microampermeter (1388). The photocurrent is proportional to the intensity of light in the current generating element (1326). The intensity of the light in the current generating element enhances resonantly, if the wavelength of the incoming light (1350) coincides with the resonance wavelength of the cavity (1240).

Applying a bias (693) to the modulator element (1262) results in a refractive index change of the quantum insertions (665) and, thus, in a change of the resonant wavelength of the cavity (1240).

A stronger electrooptic effect provided by quantum insertions (665) based on an Anti-Stark medium as compared to the conventional electrooptic medium based on Quantum Confined Stark Effect has a number of important advantages. Using an electrooptic medium having a strong electrooptic effect allows operation of a device at weaker electric fields. Therefore, given the same bias voltage, a device can be selected to have a thicker undoped modulator, which will therefore have a lower capacitance thus allowing a higher cutoff frequency for the device operation. Further advantages include but are not limited to higher temperature robustness as well as higher robustness against technological tolerances.

Intelligent Wavelength Division Multiplexing System

Figure 14:
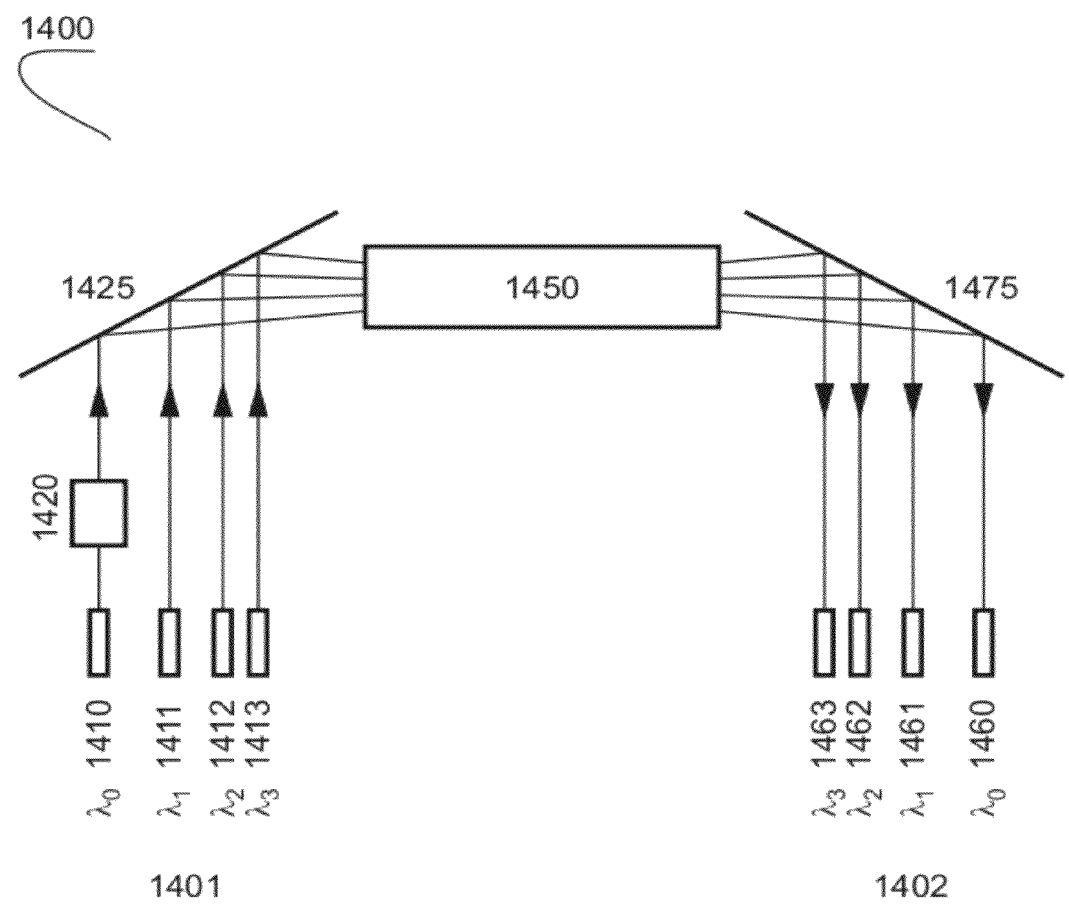
FIG. 14 shows schematically an intelligent wavelength division multipleximg system based on an array of wavelength-tunable lasers, a first diffraction grating, an optical fiber, a second diffraction grating, and an array of photodetectors, according to a further embodiment of the present invention.

FIG. 14 shows schematically an intelligent wavelength division multiplexing systems (1400), according to another embodiment of the present invention. The wavelength division multiplexing system (1400) comprises an array (1401) of wavelength-tunable lasers, a first diffraction grating (1425), an optical fiber (1450), a second diffraction grating (1475), and an array (1402) of photodetectors.

An array of lasers (1410) generates laser light having different wavelengths $\lambda_0, \lambda_1, \lambda_2, \lambda_3$. etc. such that a laser (1410) generates light having the wavelength $\lambda_0$, a laser (1411) generates light having the wavelength $\lambda_1$, a laser (1412) generates light having the wavelength $\lambda_2$, a laser (1413) generates light having the wavelength $\lambda_3$, etc. Light impinges on a first diffraction grating (1425). The first diffraction grating (1425) is selected such that light having different wavelengths and impinging on the diffraction grating is reflected at different angles such that all reflected light impinges on an input end of an optical fiber (1450) and can further propagate through the fiber (1450).

The optical fiber (1450) is preferably a multi-mode optical fiber. In another embodiment of the present invention the optical fiber (1450) is a single-mode optical fiber.

Light coming out of the output end of the optical fiber (1450) impinges on a second diffraction grating (1475). The second diffraction grating (1475) is selected such that light having different wavelengths and impinging on it is reflected at different angles such that light having a certain wavelength further impinges on a corresponding photodetector. Thus, light having different wavelengths impinges on different photodetectors. As shown in FIG. 14, light having wavelengths $\lambda_0, \lambda_1, \lambda_2, \lambda_3$. etc, impinges on photodetectors (1460), (1461), (1462), (1463), etc., correspondingly.

The array of wavelength-tunable lasers (1401) and the first diffraction grating (1425) are preferably located at a first location, and the array of phoodetectors (1460) and the second diffraction grating (1475) are preferably located at a second location, wherein the second location is different from the first location. The optical fiber (1450) connects the first and the second locations. Thus the system (1400) realizes the data transfer.

As the ambient temperature can vary, the wavelengths of the light emitted by the lasers (1410), (1411), (1412), (1413), etc., can vary as well. For proper operation of the wavelength division multiplexing system (1400), the wavelengths of the light emitted by each laser should preferably be stabilized. For this purpose, the wavelength division multiplexing system (1400) preferably contains a wavelength-stabilizing element (1420), which further contains a temperature-insensitive or a weakly temperature-sensitive filter with a feedback based on a photodetector.

The laser (1410) is the reference laser. At least part of the light emitted by the reference laser (1410) is directed, via the wavelength-stabilizing element (1420), to a photodetector, forming effectively the resonance photodetecting element.

Figure 15:
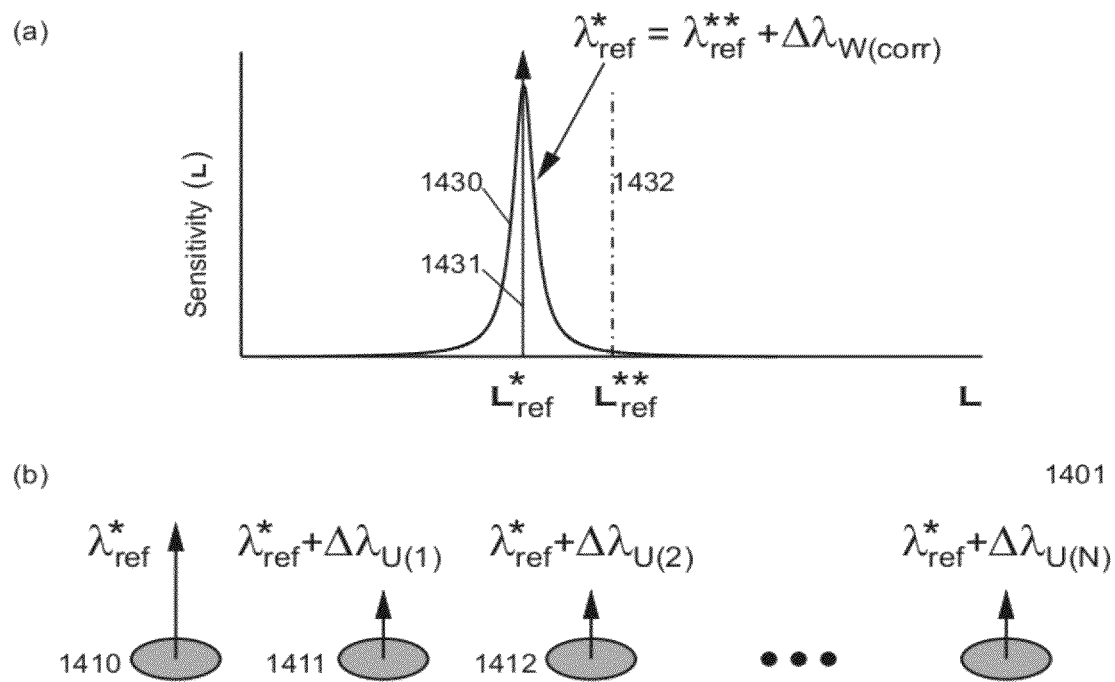
FIG. 15(a) shows a schematic illustration of a method of adjustment of the wavelengths of laser light emitted by the array of wavelength-tunable lasers of FIG. 14 to the nominal values. In particular.
FIG. 15(b) shows a schematic illustration of an array of wavelength tunable lasers with the properly adjusted wavelengths.

FIG. 15(*a*) illustrates schematically the operation principle of the wavelength-stabilizing element (1420).

FIG. 15(*a*) shows the position (1432) of the laser light emitted by the reference wavelength-tunable laser (1410) and the sensitivity curve (1430) of the reference resonant photodetector. The sensitivity curve has its maximum at $\lambda^{**}_{ref}$ different from the wavelength $\lambda^{*}_{ref}$ of the laser light emitted by the reference laser.

Then the control parameter W(corr) is applied to the reference wavelength-tunable laser, which shifts the lasing wavelength. The control parameter W(corr) is systematically varied, and the lasing wavelength of the laser (1410) changes correspondingly. The signal provided by the photodetector, e.g., the photocurrent, is observed.

At the value of the control parameter, at which the lasing wavelength of the reference wavelength-tunable laser (1410) coincides with the wavelength of sensitivity maximum of the photodetector, the signal provided by the photodetector reaches its maximum value. The position of the laser light in this case is shown in FIG. 15(*a*) by the dashed line (1431). The wavelength of the laser light corresponds to the sensitivity maximum. The value of the control parameter W(corr), at which the resonance of the reference photodetector matches to the laser light emitted by the reference laser, $$\lambda^{**}_{ref} + \Delta\lambda_{W(corr)} = \lambda^{*}_{ref}, \quad (5)$$

and the corresponding shift of the wavelength $\Delta\lambda_{W(corr)}$ are fixed and memorized.

Then the control parameters controlling the resonant wavelengths of the remaining wavelength-tunable lasers are set to the values W(1,corr), W(2,corr), ..., W(N,corr) to provide the additional shift of the wavelength equal to $\Delta\lambda_{W(corr)}$. Namely, $$\Delta\lambda_{W(1,corr)} = \Delta\lambda_{W(1)} + \Delta\lambda_{W(corr)}, \quad (6a)$$

$$\Delta\lambda_{W(2,corr)} = \Delta\lambda_{W(2)} + \Delta\lambda_{W(corr)}, \quad (6b)$$

$$\Delta\lambda_{W(N,corr)} = \Delta\lambda_{W(N)} + \Delta\lambda_{W(corr)}. \quad (6c)$$

Then all the wavelength-tunable lasers (1410), (1411), (1412), etc. are set to emit the laser light at the nominal preselected wavelengths.

The photodetectors (1460), (1461), (1462), (1463), etc. forming the array (1451) are preferably non-resonant photodetectors, and the separation of light having different wavelengths between different photodetectors is provided by the second diffraction grating (1475).

Wavelength-tunable lasers forming an array (1401) preferably comprise modulator section using an Anti-Stark electrooptic medium.

In another embodiment of the present invention, the wavelength-tunable lasers comprise a modulator section using Quantum Confined Stark Effect.

In yet another embodiment of the present invention the wavelength-tunable lasers comprise a modulator element based on a Franz-Keldysh electrooptic effect in a bulk semiconductor material.

In a further embodiment of the present invention, the tuning of the wavelength-tunable lasers is provided by micromechanical systems.

It is preferred that the modulator element in the wavelength-tunable lasers is a part of the Bragg reflector, similar to the embodiment of the present invention shown schematically in FIG. 9. In another embodiment of the present invention, the modulator element is located in the cavity thus changing the resonance wavelength of the cavity, similar to the embodiment illustrated in FIG. 12.

Under certain conditions, the optical fiber (1450) is not perfect and/or the second grating (1475) is insufficient to spatially separate light having different wavelengths between different photodetectors. Then, a further embodiment of the present invention refers to a wavelength division multiplexing system, wherein the photodetectors are also wavelength-tunable resonant photodetectors. A self-adjustable wavelength division multiplexing system based on an array of wavelength-tunable lasers and wavelength-tunable resonant photodetectors was earlier disclosed in the U.S. Pat. No. 7,075,954, "Intelligent Wavelength Division Multiplexing Systems Based on Arrays of Wavelength Tunable Lasers and Wavelength Tunable Resonant Photodetectors", issued Jul. 11, 2006, by the inventors of the present invention, which is herein incorporated by reference.

Quantum insertions based on an Anti-Stark medium are preferably used in all wavelength-tunable lasers and in all wavelength-tunable resonant photodetectors. Using an Anti-Stark electrooptic medium as compared to the conventional electrooptic medium based on Quantum Confined Stark Effect has a number of important advantages. Using an electrooptic medium having a strong electrooptic effect allows operation of a device at weaker electric fields. Therefore, given the same bias voltage, a device can be selected to have a thicker undoped modulator, which will therefore have a lower capacitance thus allowing a higher cutoff frequency for the device operation. Further advantages include higher temperature robustness as well as higher robustness against technological tolerances.

Further embodiments of the present inventions include mode-locked lasers, wherein the modulator element modulates the refractive index in one section of the laser thus changing the repetition rate of generated light pulses, which allows frequency modulation of the emitted laser light.

And yet another embodiment of the present invention is possible, wherein the the electrooptic effect is employed to reduce the speckle effect, which is one of the major problems hindering the application of high-power lasers for projection television. Variation of the refractive index of the modulator results in frequency modulation of the resonance wavelengths of the Fabri-Pérot resonator. Thus, modulation of the bias voltage in the modulator section results in frequency modulation of the wavelength of emitted laser light. The coherence of the emitted laser light remains high resulting in efficient frequency conversion. At the same time changes in the wavelength within the wavelength acceptance range of a nonlinear crystal will cause corresponding reduction of the laser speckle effect due to the eye-averaging effect.

And a further embodiment of the present invention is a Mach-Zehnder interferometer. In all these devices an Anti-Stark electrooptic medium is used. A stronger electrooptic effect provided by quantum insertions based on an Anti-Stark medium as compared to the conventional electrooptic medium based on Quantum Confined Stark Effect has a number of important advantages. Using an electrooptic medium having a strong electrooptic effect allows operation of a device at weaker electric fields. Therefore, given the same bias voltage, a device can be selected to have a thicker undoped modulator, which will therefore have a lower capacitance thus allowing a higher cutoff frequency for the device operation. Further advantages include but are not limited to higher temperature robustness as well as higher robustness against technological tolerances.

Certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the features set out in the appended claims.

The invention claimed is:

1. A wavelength division multiplexing system, comprising:
   an array of wavelength-tunable lasers including at least two wavelength-tunable lasers emitting laser light at two mutually different resonant wavelengths, said array of wavelength-tunable lasers disposed at a first location;
   a first diffraction grating disposed to have laser light emitted by said at least two different wavelength-tunable lasers having at least two different wavelengths impinge upon said first diffraction grating, and to reflect the laser light impinging thereupon;
   an optical fiber with an input end disposed at a first location and an output end disposed at a second location being different from said first location, said optical fiber disposed to have the laser light reflected by said first diffraction grating impinge upon said input end, propagate in said optical fiber, and exit from said output end of said optical fiber;
   a second diffraction grating disposed to reflect the laser light having at least two different wavelengths impinging thereon;
   an array of photodetectors disposed at said second location, said array of photodetectors including a first photodetector and a second photodetector different from said first photodetector, said photodetectors disposed to receive the laser light reflected by said second diffraction grating, wherein the laser light having a first wavelength impinges on said first photodetector and laser light having a second wavelength impinges on said second photodetector;
   at least one reference wavelength-tunable laser for emitting light at a lasing wavelength, at least one reference resonant photodetector, and a wavelength stabilizing element disposed to direct at least part of the light emitted by said at least one reference wavelength-tunable laser to said at least one reference resonant photodetector, said at least one reference wavelength-tunable laser and said at least one reference resonant photodetector disposed at said first location; and
   a control unit for operating the system with wavelength stabilization, said control unit being configured to:
   a) apply a control parameter to said at least one reference wavelength-tunable laser for shifting the lasing wavelength of said at least one reference wavelength-tunable laser,
   b) observe a signal provided by the at least one reference resonant photodetector as a function of the shifted lasing wavelength of the at least one reference wavelength-tunable laser,
   c) fix and memorize a value of the control parameter and a corresponding optimum shift of the lasing wavelength of the at least one reference wavelength-tunable laser at which the signal provided by the at least one reference resonant photodetector reaches a maximum value, and
   d) set control parameters controlling the resonant wavelengths of the at least two wavelength-tunable lasers such that the resonant wavelengths of the at least two wavelength-tunable lasers shift an amount equal to the optimum shift of the lasing wavelength of the at least one reference wavelength-tunable laser;
   wherein said control unit is adapted to cause the at least two wavelength-tunable lasers to lase at preselected wavelengths by carrying out steps a) to d).

2. The wavelength division multiplexing system according to claim 1, wherein the laser light impinging on each said photodetector of said array of photodetectors contains laser light of only one wavelength.

3. A wavelength stabilization method, which comprises:
   a) providing a wavelength division multiplexing system according to claim 1;
   b) applying the control parameter to the at least one reference wavelength-tunable laser for shifting the lasing wavelength of the at least one reference wavelength-tunable laser;
   c) observe the signal provided by the at least one reference resonant photodetector as a function of the shifted lasing wavelength of the at least one reference wavelength-tunable laser;
   d) fix and memorize the value of the control parameter and the corresponding optimum shift of the lasing wavelength of the at least one reference wavelength-tunable laser at which the signal provided by the at least one reference resonant photodetector reaches the maximum value;
   e) set control parameters controlling the resonant wavelengths of the at least two wavelength-tunable lasers having at least two different wavelengths such that the shifts of the resonant wavelengths equals the optimum shift of the lasing wavelength of the at least one reference wavelength-tunable laser;
   such that, by carrying out steps b) to e), the at least two wavelength-tunable lasers lase at the preselected wavelengths.

* * * * *